United States Patent [19]
Kim et al.

[11] Patent Number: 6,100,954
[45] Date of Patent: *Aug. 8, 2000

[54] LIQUID CRYSTAL DISPLAY WITH PLANARIZING ORGANIC GATE INSULATOR AND ORGANIC PLANARIZATION LAYER AND METHOD FOR MANUFACTURING

[75] Inventors: Jeong-Hyun Kim; Woong-Kwon Kim; Ki-Hyun Lyu, all of Anyang-shi; Sung-Il Park, Dacku-shi; Kyoung-Nam Lim; Hoo-Young Lee, both of Seoul, all of Rep. of Korea

[73] Assignee: LG Electronics Inc., Seoul, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/826,804

[22] Filed: Mar. 25, 1997

[30] Foreign Application Priority Data

| Mar. 26, 1996 | [KR] | Rep. of Korea | 96-8344 |
| Jun. 19, 1996 | [KR] | Rep. of Korea | 96-22404 |
| Jun. 24, 1996 | [KR] | Rep. of Korea | 96-23295 |
| Jun. 24, 1996 | [KR] | Rep. of Korea | 96-23296 |
| Jun. 25, 1996 | [KR] | Rep. of Korea | 96-23448 |

[51] Int. Cl.$^7$ .......................... G02F 1/1333; G02F 1/136
[52] U.S. Cl. ...................... 349/138; 349/43; 257/59; 257/410; 257/411; 257/642; 257/759
[58] Field of Search .................... 359/42, 43, 46, 359/122, 138; 257/59, 72, 410, 411, 759, 752; 438/623, 626, 631, 780, 723; 287/40, 324, 642, 643

[56] References Cited

U.S. PATENT DOCUMENTS

| 4,636,038 | 1/1987 | Kitahara et al. | 350/339 |
| 4,943,838 | 7/1990 | Ukai | 257/410 |
| 5,072,262 | 12/1991 | Uekita et al. | 257/410 |
| 5,229,644 | 7/1993 | Wakai et al. | 257/749 |
| 5,246,782 | 9/1993 | Kennedy et al. | 428/421 |
| 5,294,820 | 3/1994 | Gemma et al. | 257/324 |
| 5,486,493 | 1/1996 | Jeng | 437/195 |
| 5,585,951 | 12/1996 | Noda et al. | 349/122 |
| 5,591,676 | 1/1997 | Hughes et al. | 438/702 |
| 5,641,974 | 6/1997 | Den Boer et al. | 257/59 |
| 5,675,187 | 10/1997 | Numata et al. | 257/758 |
| 5,721,596 | 2/1998 | Kochi | 349/2 |
| 5,721,601 | 2/1998 | Yamaji et al. | 349/138 |
| 5,780,121 | 7/1998 | Endo et al. | 438/780 |
| 5,821,621 | 10/1998 | Jeng | 257/759 |

FOREIGN PATENT DOCUMENTS

| 63-279228 | 11/1988 | Japan . |
| 63-289965 | 11/1988 | Japan . |
| 04068318 | 3/1992 | Japan . |
| 4-068318 | 3/1992 | Japan . |
| 04163528 | 6/1992 | Japan . |
| 4-163528 | 6/1992 | Japan . |

OTHER PUBLICATIONS

Sakamoto et al, A High Aperture Ratio 3 inch diagonal VGA a–Si Light valve with Pixel Data and Pixel Gate Lines Overlapping, SID, 1996.

M.J. Radler et al., Cyclotene™ Advanced Electronics Resins for High–Aperture AMLCD Applications, SID 96 Applications Digest, pp. 33–36 (1996).

D.J. Perettie et al., Benzocycloutene as a Planarization Overcoat for Flat Panel Displays, Asia Display '95, pp. 721–724 (1995).

(List continued on next page.)

*Primary Examiner*—Kenneth Parker
*Attorney, Agent, or Firm*—Morgan, Lewis & Bockius LLP

[57] ABSTRACT

A thin film transistor substrate for a liquid crystal display includes a substrate; a thin film transistor over the substrate, the thin film transistor having a gate, a source, a drain, a semiconductor layer, and a gate insulation layer; and a protection film over the thin film transistor, the protection film including at least one of fluorinated polyimide, Teflon, cytop, fluoropolyarylether, Fluorinated parylene, PFCB, and BCB.

24 Claims, 34 Drawing Sheets

OTHER PUBLICATIONS

Koji Kishimoto, Low–dielectric–constant interlayer insulatiiong film and its manufacturing method, Electronic Journal, pp. 33–35 (Mar. 1996).

Toshihara Ueki et al., Dye embedded BM resin and three dimensional picture element implemented by BM on Array technology for the first time, Nikkei Microdevices, pp. 60–62 (Jul. 1994).

a : $V_{DS}$ = 20V
b : $V_{DS}$ = 10V
c : $V_{DS}$ = 0.1V

LIQUID CRYSTAL DISPLAY WITH PLANARIZING ORGANIC GATE INSULATOR AND ORGANIC PLANARIZATION LAYER AND METHOD FOR MANUFACTURING

BACKGROUND OF THE INVENTION

1. Field of the Invention

The present invention relates to a liquid crystal display (LCD) and a method for manufacturing the same, and more particularly, to a liquid crystal display having a thin film transistor and a method for manufacturing the same.

2. Discussion of the Related Art

Recently, among various display devices for displaying picture information, a flat panel display device has been developed due to its advantages of light weight and portability. Among others, the development of an LCD is one of the most active research areas. This is because an LCD can provide a high quality image, a high resolution, and a high response speed necessary to display motion pictures.

The principle of an LCD resides in optical polarity and anisotropy of a liquid crystal. Transmission of a light is controlled by giving an optical anisotropy to liquid crystal molecules; aligning the liquid crystal molecules in different orientations using the polar nature of the liquid crystal molecules. An LCD is composed of two transparent substrates separated by a certain distance. A liquid crystal material is injected into the space between the substrates on which various elements are formed to drive the liquid crystal. In general, thin film elements such as thin film transistors are manufactured on one of the substrates (thin film transistor substrate). Therefore, the performance of an LCD depends significantly upon the method of manufacture and the structure of such thin film elements. Moreover, an active matrix liquid crystal display (AMLCD), which has recently been commercialized, shows various performance fluctuations depending on the method of manufacture and the structure of the thin film transistor and other related elements. The details of a conventional active matrix liquid crystal display will be described below.

First, referring to FIG. 1, the structure of a conventional AMLCD is reviewed. Rectangular pixels, each of which represents a point of picture information, are disposed to form a matrix array. Gate bus lines 15 and signal bus lines 25 are arranged in columns and rows defining the array. At the intersection between the gate bus line and the signal bus line, a switching element is formed. In general, a thin film transistor (TFT) is used as the switching element. The source electrode 23 of the TFT is connected to the signal bus line 25 (source bus line or data bus line) and the gate electrode 13 of the TFT is connected to the gate bus line 15. A pixel electrode 31 and a common electrode are formed at each pixel to apply an electric field to the liquid crystal. The pixel electrode 31 is connected to the drain electrode 27 of the TFT. Therefore, when the TFT is turned on by applying appropriate voltages to the gate and signal bus lines, the signal voltage is applied to the pixel electrode 31. This voltage creates an electric field between the pixel electrode and the common electrode. Then, the electric field forces the liquid crystal molecules to align in a certain orientation which depends on the field direction. Therefore, transmission of a light can be controlled by an artificial control of the orientation of the liquid crystal molecules. This characteristic of a liquid crystal is utilized to display picture information.

Second, a method for manufacturing a conventional AMLCD is reviewed. Two transparent substrates are prepared to construct an LCD. In general, the substrates are made of non-alkaline or soda glass. Different processes are applied to the two substrates. On the first substrate (upper plate), a color filter layer, a black matrix, common electrodes, and bus lines are formed. On the second substrate (lower plate), switching elements such as TFTs, pixel electrodes, and bus lines are formed.

This invention particularly relates to a second substrate of an AMLCD, on which TFTs are formed. Therefore, conventional methods for manufacturing the second substrate will be mainly described below.

There are various AMLCDs depending on the method of manufacture and the structure. The AMLCDs can be classified according to the structure of a TFT. Typical structures of TFTs for an LCD are illustrated in FIGS. 2A to 5G.

FIGS. 2A to 2F, taken along the line I—I in FIG. 1, show an inverse staggered TFT, which uses amorphous silicon (a-Si) as a semiconductor layer. The method of manufacturing the inverse staggered TFT is as follows. A first metal, such as Ti, Cr, Ta, Al, Ti-Mo, Mo-Ta, or Al-Ta, (1000 to 2000 Å thick) is deposited on a glass substrate 11. The metal is patterned to form a gate bus line 15 and a gate electrode 13(FIG. 2A), followed by the overall deposition of silicon nitride ($SiN_x$) to form a gate insulation layer 17 (FIG. 2B). A thin film of an amorphous semiconductor material such as a-Si and a thin film of an impurity-doped amorphous semiconductor material such as $n^+$ a-Si are sequentially deposited (1500 to 2000 Å thick and 300 to 500 Å thick, respectively) on the gate insulation film 17. They are patterned to form a semiconductor layer 19 and an impurity-doped semiconductor layer 21, as shown in FIG. 2B. Then, a second metal such as Cr, Mo, Ti, or Cr-Al (1000 to 2000 Å thick)is deposited and patterned to form a signal bus line 25, a source electrode 23, and a drain electrode 27. The exposed portion of the impurity-doped semiconductor layer 21 is removed using the source and drain electrodes as a mask. At this moment, the impurity-doped semiconductor layer 21 makes an ohmic contact with the source electrode 23 and the drain electrode 27 (FIG. 2C). Next, silicon nitride ($SiN_x$) is deposited to form a protection film 29 protecting the TFT formed under the film and providing an electrical insulation of the TFT from liquid crystal. Then, a contact hole is formed in the protection film 29 over the drain electrode 27, for connecting the drain electrode 27 to a pixel electrode, as shown in FIG. 2D. Indium tin oxide (ITO) 500 to 1000 A thick, conducting metal, is deposited and patterned to form a pixel electrode 31, as shown in FIG. 2E. This completes the manufacture of the inverse staggered TFT.

Here, when removing the impurity-doped semiconducting layer 21 located between a source electrode and a drain electrode, a silicon nitride layer may be formed as an etch stopper 35 to prevent the over-etching of the semiconducting layer 19, as shown in FIG. 2F.

FIGS. 3A to 3D show a staggered TFT, which uses an amorphous silicon (a-Si) as the semiconductor layer. The structure is inverse to the inverse staggered TFT described above. The method of manufacturing a staggered TFT structure is as follows. A first metal and an impurity-doped semiconductor material are deposited on a glass substrate 11. They are patterned to form a signal bus line 25, a source electrode 23, a drain electrode 27, and an impurity-doped semiconductor layer 21, as shown in FIG. 3A. Then, an amorphous silicon material, an insulation material such as SiNx or $SiO_2$, and a second metal are sequentially deposited on the whole substrate including the impurity-doped semiconductor layer, and patterned at once to form a semiconductor layer 19, a gate insulation layer 17, a gate bus line (not shown in the drawings) and a gate electrode 13, respectively. The exposed portion of the impurity-doped semiconductor layer 21 is then removed, as shown in FIG. 3B. Here, the impurity-doped semiconductor layer 21 makes an ohmic contact with the source electrode 23 and the drain electrode 27. Next, a protection layer 29 is formed on the overall surface (FIG. 3C). A contact hole is formed in the protection layer 29 above the drain electrode 27. Finally, a pixel electrode 31 is formed and connected to the drain electrode 27 through the contact hole (FIG. 3D). This completes the manufacture of the staggered TFT.

FIGS. 4A to 4D show a coplanar TFT which uses polycrystalline silicon intrinsic semiconductor material (Poly-Si) as the semiconductor layer. The method for manufacturing a coplanar is as follows. A polycrystalline semiconductor material such as poly-Si and an impurity-doped polycrystalline semiconductor material are sequentially deposited on a transparent glass substrate 11 and patterned to form a semiconductor layer 19 and an impurity-doped semiconductor layer 21, as shown in FIG. 4A. Then, a first metal such as Al or an Al alloy is deposited and patterned to form a signal bus line 25, a source electrode 23 and a drain electrode 27. Subsequently, the exposed portion of the impurity-doped semiconductor layer 21 located between the source and drain electrodes is removed (FIG. 4B). Here, the impurity-doped semiconductor layer 21 makes an ohmic contact with the source and drain electrodes. Next, silicon oxide ($SiO_2$) is deposited and patterned to form a gate insulation layer 17. Subsequently, a second metal such as Cr is deposited and patterned to form a gate bus line and a gate electrode 13. Then, silicon oxide ($SiO_2$) is deposited to form a protection film 29, as shown in FIG. 4C. A contact hole is formed in the protection film 29 on the drain electrode 27. Finally, a pixel electrode 31 is formed by the deposition and patterning of ITO and connected to the drain electrode 27 through the contact hole (FIG. 4D). This completes the manufacture of the coplanar TFT.

FIGS. 5A to 5G show a self-aligned TFT. The method for manufacturing a self-aligned TFT is as follows. A semiconductor layer 19 is formed on a transparent substrate 11 by depositing and patterning a polycrystalline intrinsic semiconductor material. There are three methods to form a polycrystalline semiconductor layer, in general. First, polycrystalline silicon is formed by depositing and patterning an amorphous silicon and annealing it by laser. Second, polycrystalline silicon is formed by depositing an amorphous silicon and thermally annealing it. Third, a polycrystalline silicon material is directly deposited. After forming the semiconductor layer 19, silicon oxide and a first metal are sequentially deposited and patterned to form a gate insulation layer 17, a gate electrode 13, and a gate bus line (not shown in the drawings) as shown in FIG. 5B. At this time, the gate electrode 13 and the gate insulation layer 17 should be formed substantially at the center of the semiconductor layer 19. As shown in FIG. 5C, the edge portion of the semiconductor layer 19 are turned into a first impurity-doped semiconductor layers 21 by injecting impurity-ions into the semiconductor layer 19 using the gate electrode 13 as a mask (impurity concentration of $10^{14}$ to $10^{16}$ cm$^{-3}$). Then, a photoresist is coated to cover a desired portion of the first impurity-doped semiconductor layer 21. Subsequently, as shown in FIG. 5D, a second impurity-doped semiconductor layer 21' is formed by injecting impurity-ions (impurity concentration of $10^{16}$ to $10^{18}$ cm$^{-3}$). The first impurity-doped semiconductor layer 21 is a lightly-doped drain (LDD) part with impurity ions having lower density than the second impurity-doped semiconductor layer 21'.

Here, the impurity injecting step described with reference to FIG. 5C can be omitted. In this case, a photoresist is coated to cover a certain part of the semiconductor layer 19, an impurity doped semiconductor layer 21' is formed by injecting impurityions (impurity concentration of $10^{16}$ to $10^{18}$ cm$^{-3}$). The part covered by the photoresist becomes an offset part with no injected ions.

Next, a first protection film 29 is formed by depositing silicon oxide on the whole surface, as shown in FIG. 5E. First contact holes are formed in the protection film 29. A second metal is deposited and patterned to form a signal bus line 25, a source electrode 23, and a drain electrode 27, which are connected to the impurity-doped semiconductor layer 21' through the contact holes. Then, ITO is deposited and patterned to form a pixel electrode 31 connected to the drain electrode 27, as shown in FIG. 5F. Alternatively, a second protection film 33 covering the source and drain electrodes may be deposited on the whole surface after depositing and patterning the second metal, and then a second contact hole and the pixel electrode may be formed (FIG. 5G).

The above-described conventional AMLCDs have the following drawbacks. First, as shown in FIG. 6, a stepped surface appears due to a multilayer structure of the TFT and bus lines. The figure shows the structure in which the gate insulation layer 17 is deposited on the gate bus line 15, and the signal bus line 25 is formed so as to cross the gate bus line. Thus, line disconnection and short circuit may occur at the intersection between the signal bus line and the gate bus line. Second, high parasitic capacitance is generated when a pixel electrode overlaps one of the bus lines, because an inorganic film such as $SiN_x$ or $SiO_x$ has a relatively high dielectric constant. Therefore, a pixel electrode is formed so as to have a predetermined space between the pixel electrode and the bus lines, as shown in FIG. 1. In this case, since the backscattered light passing through the space is undesirable, a black matrix, which blocks the backscattered light, is formed to cover the space between the bus line and the pixel electrode. This structure, however, has an insufficient aperture ratio. Third, after coating an alignment film for liquid crystal, a rubbing process is necessary for setting a pretilting angle in the alignment film, which determines the initial orientation of liquid crystal. The rubbing process, however, does not work properly on a surface with significant steps, and a domain phenomenon occurs and yields a different orientation from the intended one, which reduces the quality of the LCD.

The best or at least a good solution to these problems is to smooth the stepped profile due to the multilayer structure. Using a material having a high planarization property for a gate insulation layer and/or a protection film achieves this purpose.

Examples of such material having the high planarization property have been introduced in Japanese patents: 4-163528, 83-289965, 4-68318, and 63-279228.

These patents use polyimide or acryl resin as a protection film in order to obtain a smooth surface over the TFT. However, since the adhesion property between the resins and ITO (a pixel electrode) is poor, it is necessary to form a thin intermediate layer of an inorganic material prior to the ITO deposition to prevent the detachment of ITO during the patterning. In addition, the upper processing temperature for these materials, ranging from 350 to 400° C., is too high for a protection film of a TFT. In general, when the processing temperature for the insulation or protection film is higher than 250° C., the TFT characteristics may be affected by temperature. Also, the dielectric constant of polyimide is 3.4 to 3.8, similar to that of SiNx, 3.5. Therefore, a parasitic capacitance can not be sufficiently reduced.

It is evident that the problem associated with the stepped surface can be solved by the use of a material that has a smooth surface when applied for a protection or insulation layer. However, it is difficult to select such a material, taking into account various conditions/environment of an LCD. The following conditions should be met for a material used as an insulation or protection film.

First, the material should have a low dielectric constant when used for electrical insulation such as gate insulation, to prevent errors in the TFT operation by parasitic capacitance. The dielectric constants of SiNx and $SiO_2$ for a conventional use are about 7 and 4, respectively. Second, the material should have a superior insulation property: high intrinsic resistivity. Third, when used as a protection film, the material should have a good adhesion property to ITO which is deposited on the protection film to form a pixel electrode.

Summary of the Invention

Accordingly, the present invention is directed to a liquid crystal display and a method for manufacturing the same that substantially obviates one or more of the problems due to limitations and disadvantages of the related art.

An object of the present invention is to provide an LCD having a thin film transistor substrate whose surface does not have stepped profile due to a multilayered structure.

Another object of the present invention is to provide an LCD which has less parasitic capacitance.

Another object of the present invention is to provide an LCD which is free from problems such as election trapping and poor adhesion at the interface between an insulation layer and a semiconductor layer.

A further object of the present invention is to provide an LCD which has an improved aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the liquid crystal display includes a substrate; a thin film transistor over the substrate, the thin film transistor having a gate, a source, a drain, a semiconductor layer, and a gate insulating layer; and a protection film over the thin film transistor, wherein the protection film includes a material derived from Fluorinated polyimide, Teflon, cytop, fluoropolyarylether, Fluorinated parylene, PFCB(perfluorocyclobutane), or BCB(benzocyclobutene).

In another aspect, the liquid crystal display includes a substrate; and a thin film transistor over the substrate, the thin film transistor having a gate, a source, a drain, a semiconductor layer, and a gate insulating layer, wherein the gate insulating layer includes a material derived from Flu-orinated polymide, teflon, cytop, fluoropolyarylether, Fluorinated parylene, PFCB, or BCB.

In another aspect, the method of manufacturing an LCD which has switching elements including signal electrodes, insulating layers, semiconductor layers, impure semiconductor layers, data electrodes and out-put electrodes, data bus lines connected with the data electrodes, protection layers (e.g. passivation layers) protecting the switching elements and pixel electrodes, all of them being formed on a substrate, includes the steps of forming at least one of the insulating layer and the protection layer with an organic material.

In another aspect, the method of manufacturing an LCD includes the steps of depositing a first metal on a substrate and forming a gate bus line and a gate electrode by patterning the first metal; forming a gate insulating layer by depositing organic material on the whole surface of the substrate on which the gate bus line and the gate electrode are already formed; sequentially depositing intrinsic semiconductive material and impure semiconductive material on the gate insulating layer and forming a semiconductor layer and an impure semiconductor layer by patterning the intrinsic semiconductive material and the impure semiconductive material; depositing a second metal on the whole surface of the substrate on which the impure semiconductor layer is already formed and forming a source bus line, a source electrode and a drain electrode by patterning the second metal layer; forming a protection layer by depositing inorganic material on the whole surface of the substrate on which the source and drain electrodes are formed; forming a contact hole in a portion of the protection layer over the drain electrode; and depositing a transparent conductive material on the whole surface of the substrate on which the protection layer with organic material is formed subsequently and forming a pixel electrode by patterning the transparent conductive material, the pixel electrode being electrically connected with the drain electrode through the contact hole.

In another aspect, the method of manufacturing an LCD includes the steps of sequentially depositing a first metal and an impure semiconductive material on a substrate and forming a source bus line, source and drain electrodes and an impure semiconductor layer by patterning the first metal and the impure semiconductive material; depositing intrinsic semiconductive material on the substrate on which the impure semiconductor layer is formed and forming a semiconductor layer by patterning the intrinsic semiconductive material; forming a gate insulating layer by depositing an organic material on the whole surface of the substrate on which the semiconductor layer is formed; depositing a second metal on the gate insulating layer and forming a gate electrode and a gate bus line by patterning the second metal; forming a protection layer by depositing an inorganic material on the whole surface of the substrate on which the gate electrode and the gate bus line are formed; forming a contact hole in a portion of the gate insulating layer and the protection layer over the drain electrode; and depositing a transparent conductive material on the protection layer and forming a pixel electrode by patterning the transparent conductive material.

In another aspect, the method of manufacturing an LCD includes the steps of sequentially depositing an intrinsic semiconductive material and an impure semiconductive material on a substrate and forming a semiconductor layer and an impure semiconductor layer by patterning the intrinsic semiconductive material and the impure semiconductive material; depositing a first metal on the substrate on which the impure semiconductor layer is formed and forming a source bus line, a source electrode and a drain electrode by patterning the first metal; forming a gate insulating layer by depositing organic material on the whole surface of the substrate on which the source and drain electrodes are formed; depositing a second metal on the gate insulating layer and forming a gate bus line and a gate electrode by patterning the second metal; forming a protection layer by depositing inorganic material on the whole surface of the substrate on which the gate electrode is formed; forming a contact hole in a portion of the gate insulating layer and the protection layer covering the drain electrode; and depositing a transparent conductive material on the production layer and forming a pixel electrode by patterning the transparent conductive material, the pixel electrode being electrically connected with the drain electrode through the contact hole.

In another aspect, the method of manufacturing an LCD includes the steps of depositing a first metal on a substrate and forming a gate bus line and a gate electrode by patterning the first metal; forming a gate insulating layer by depositing an inorganic material on the whole surface of the substrate on which the gate bus line and the gate electrode are formed; sequentially depositing an intrinsic semiconductive material and an impure semiconductive material on the gate insulating layer and forming a semiconductor layer and an impure semiconductor layer by patterning the intrinsic semiconductive material and the impure semiconductive material; depositing a second metal on the whole surface of the substrate on which the impure semiconductor layer is formed and forming a source bus line, a source electrode and a drain electrode by patterning the second metal; forming a protection layer by depositing organic material on the whole surface of the substrate on which the source and drain electrodes are formed; forming a contact hole in a portion of the protection layer covering the drain electrode; and depositing a transparent conductive material on the substrate on which the protection layer is formed and forming a pixel electrode by patterning the transparent conductive material, the pixel electrode being electrically connected with the drain electrode through the contact hole.

In another aspect, the method of manufacturing an LCD includes the steps of sequentially depositing a first metal and an impure semiconductive material on a substrate and forming a source bus line, a source electrode, a drain electrode and an impure semiconductor layer by patterning the first metal and the impure semiconductive material; depositing intrinsic semiconductive material on the substrate on which the impure semiconductor layer is formed and forming a semiconductor layer by patterning the intrinsic semiconductive material; forming a gate insulating layer by depositing inorganic material on the whole surface of the substrate on which the semiconductor layer is formed; depositing a second metal on the gate insulating layer and forming a gate electrode and a gate bus line by patterning the second metal; forming a protection layer by depositing organic material on the whole surface of the substrate on which the gate electrode and the gate bus line are formed; forming a contact hole in the gate insulating layer and the protection layer over the drain electrode; and depositing a transparent conductive material on the protection layer and forming a pixel electrode by patterning the transparent conductive material.

In another aspect, the method of manufacturing an LCD includes the steps of sequentially depositing an intrinsic semiconductive material and an impure semiconductive material on a substrate and forming a semiconductor layer and an impure semiconductor layer by patterning the intrinsic semiconductive material and the impure semiconductive material; depositing a first metal on the substrate on which the impure semiconductor layer is formed and forming a source bus line, a source electrode and a drain electrode by patterning the first metal; forming a gate insulating layer by depositing an inorganic material on the whole surface of the substrate on which the source and drain electrodes are formed; depositing a second metal on the gate insulating layer and forming a gate bus line and a gate electrode by patterning the second metal; forming a protection layer by depositing an organic material on the whole surface of the substrate on which the gate electrode is formed; forming a contact hole in the insulating layer and the protection layer over the drain electrode; and depositing a transparent conductive material on the protection layer and forming a pixel electrode by patterning the transparent conductive material, the pixel electrode being electrically connected with the drain electrode through the contact hole.

In another aspect, the method of manufacturing an LCD includes the steps of depositing a first metal on a substrate and forming a gate bus line and a gate electrode by patterning the first metal; forming a gate insulating layer by depositing an organic material on the whole surface of the substrate on which the gate bus line and the gate electrode are formed; sequentially depositing an intrinsic semiconductive material and an impure semiconductive material on the gate insulating layer and forming a semiconductor layer and an impure semiconductor layer by patterning the intrinsic semiconductive material and the impure semiconductive material; depositing a second metal on the whole surface of the substrate on which the impure semiconductor layer is formed and forming a source bus line, a source electrode and a drain electrode by patterning the second metal; forming a protection layer by depositing an organic material on the whole surface of the substrate on which the source and drain electrodes are formed; forming a contact hole in a portion of the protection layer covering the drain electrode; and depositing a transparent conductive material on the whole surface of the substrate on which the protection is formed and forming a pixel electrode by patterning the transparent conductive material, the pixel electrode being electrically connected with the drain electrode through the contact hole.

In another aspect, the method of manufacturing an LCD includes the steps of sequentially depositing a first metal and an impure semiconductive material on a substrate and forming a source bus line, a source electrode, a drain electrode and an impure semiconductor layer by patterning the first metal and the impure semiconductive material; depositing an intrinsic semiconductive material on the substrate on which the impure semiconductor layer is formed and forming a semiconductor layer by patterning the intrinsic semiconductive material; forming a gate insulating layer by depositing an organic material on the whole surface of the substrate on which the semiconductor layer is formed; depositing a second metal on the gate insulating layer and forming a gate electrode and a gate bus line by patterning the second metal; forming a protection layer by depositing organic material on the whole surface of the substrate on which the gate electrode and the gate bus line are formed; forming a contact hole in the gate insulating layer and the protection layer over the drain electrode; and depositing a transparent conductive material on the protection layer and forming a pixel electrode by patterning transparent conductive material.

In another aspect, the method of manufacturing an LCD includes the steps of sequentially depositing an intrinsic semiconductive material and an impure semiconductive material on a substrate and forming a semiconductor layer and an impure semiconductor layer by patterning the intrinsic semiconductive material and the impure semiconductive material; depositing a first metal on the substrate on which the impure semiconductor layer is formed and forming a source bus line, a source electrode and a drain electrode by patterning the first metal; forming a gate insulating layer by depositing an organic material on the whole surface of the substrate on which the source and drain electrodes are formed; depositing a second metal on the gate insulating layer and forming a gate bus line and a gate electrode by patterning the second metal; forming a protection layer by depositing an organic material on the whole surface of the substrate on which the gate electrode is formed; forming a contact hole in the insulating layer and the protection layer covering the drain electrode; and depositing a transparent conductive material on the whole surface of the protection layer and forming a pixel electrode by patterning the transparent conductive material, the pixel electrode being electrically connected with the drain electrode through the contact hole.

In another aspect, the LCD includes a substrate, signal bus lines and data bus lines formed on the substrate, switching elements being connected with the signal and data lines, a protection layer, made of insulating material and protecting the switching elements, and pixel electrodes driven by the switching elements, in which at least one of the components of the switching elements and the protection layer is made of organic material.

In another aspect, the LCD showing picture information includes a substrate; gate bus lines delivering signals of the picture information; gate electrodes which are branched out from the gate bus lines; a gate insulating layer, made of an organic material, covering the gate bus lines and the gate electrodes; a semiconductor layer formed on the gate insulating layer; an impure semiconductor layer formed on the semiconductor layer; source bus lines delivering the picture information; source electrodes which are branched out from the source bus lines and connected with the semiconductor layer; drain electrodes which are opposite to the source electrodes and connected with the semiconductor layer; a protection layer covering the above mentioned elements formed on the substrate; and pixel electrodes being electrically connected with the drain electrodes.

In another aspect, the LCD showing picture information includes a substrate; gate bus lines delivering signals of the picture information; gate electrodes which are branched out from the gate bus lines; a gate insulating layer covering the gate bus lines and the gate electrodes; a semiconductor layer formed on the gate insulating layer; an impure semiconductor layer formed on the semiconductor layer; source bus lines delivering data of the picture information; source electrodes which are branched out from the source bus lines and connected with the semiconductor layer; drain electrodes which are opposite to the source electrodes and connected with the semiconductor layer; a protection layer, made of an organic material, covering the above mentioned elements formed on the substrate; pixel electrodes being electrically connected with the drain electrodes.

In another aspect, the LCD showing picture information includes a substrate; gate bus lines delivering signals of the picture information; gate electrodes which are branched out from the gate bus lines; a gate insulating layer, made of an organic material, covering the gate bus lines and the gate electrodes; a semiconductor layer formed on the gate insulating layer; an impure semiconductor layer formed on the semiconductor layer; source bus lines delivering data of the picture information; source electrodes which are branched out from the source bus lines and connected with the semiconductor layer; drain electrodes which are opposite to the source electrodes and connected with the semiconductor layer; a protection layer, made of an organic material, covering the above mentioned elements; and pixel electrodes being electrically connected with the drain electrodes.

In another aspect, a transistor substrate for a liquid crystal display includes a substrate; a transistor over the substrate, the transistor having a gate, a source, a drain, a semiconductor layer, and a gate insulation layer; and a protection layer over the transistor, the protection layer including at least one of Fluorinated polyimide, Teflon, cytop, fluoropolyarylether, Fluorinated para-xylene, PFCB, and BCB.

In another aspect, a transistor substrate for a liquid crystal display includes a substrate; and a thin transistor over the substrate, the transistor having a gate, a source, a drain, a semiconductor layer, and a gate insulation layer, the gate insulation layer including at least one of Fluorinated polyimide, Teflon, cytop, fluoropolyarylether, Fluorinated parylene, PFCB, and BCB.

In another aspect, a method of manufacturing a thin film transistor (TFT) on a substrate for a liquid crystal display includes the steps of forming a transistor over the substrate, the transistor having a gate, a source, a drain, a semiconductor layer, and a gate insulation layer; and forming a protection layer over the transistor, the protection layer including at least one of Fluorinated polyimide, Teflon, cytop, fluoropolyarylether, Fluorinated parylene, PFCB, and BCB.

In a further aspect, a method of manufacturing a thin film transistor (TFT) on a substrate for a liquid crystal display includes the steps of forming the TFT over the substrate, the TFT having a gate, a source, a drain, a semiconductor layer, and a gate insulation layer, wherein the gate insulation layer includes at least one of Fluorinated polyimide, Teflon, cytop, fluoropolyarylether, Fluorinated parylene, PFCB, and BCB.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Before discussing the details of the preferred embodiments of the present invention, information regarding organic materials is discussed.

This invention uses an organic material having a high planarization property, as it complies with the conditions mentioned above. However, new problems could arise when using an organic material for an insulation film and a protection film in an LCD. These are as follows.

A technology relating to the manufacture of a TFT is very important and complicated in the manufacture of an LCD which uses a thin film transistor as a switching element. In particular, the performance of the switching element depends upon the selection of TFT materials. When a new TFT material is tried, it is difficult to anticipate the resultant performance of the TFT. When an organic material, as in this invention, is used as a gate insulation layer or protection film, the organic material comes in contact with a semiconductor material in which a channel layer of the TFT is formed. In this case, an unexpected problem may occur. Conventionally, a chemical vapor deposition (CVD) process has been used for the formation of an insulation film or semiconductor layer. The chemical reaction in the CVD chamber for the formation of $SiO_2$ as a gate insulation layer is as follows.

$$SiH_4 + 2N_2O = SiO_2 + 2N_2 + 2H_2$$

And the chemical reaction in the CVD chamber for the formation of $Si_3N_4$, which is mainly used for a protection film is as follows.

$$3SiH_4 + 4NH_3 = Si_3N_4 + 12H_2$$

Finally, the chemical reaction for the formation of silicon is as follows.

$$SiH_4 = Si + 2H_2$$

When the insulation film or protection film that includes silicon is formed on a silicon semiconductor layer, the insulation film or protection film is formed by a similar CVD process to that in the formation of the semiconductor layer. Thus, chemical bondings are created at the interface between the film and the silicon semiconductor layer. However, an organic material, which is spin coated on the surface of the silicon semiconductor, does not provide chemical bondings at the interface. This causes the following two problems.

Figure 7A:
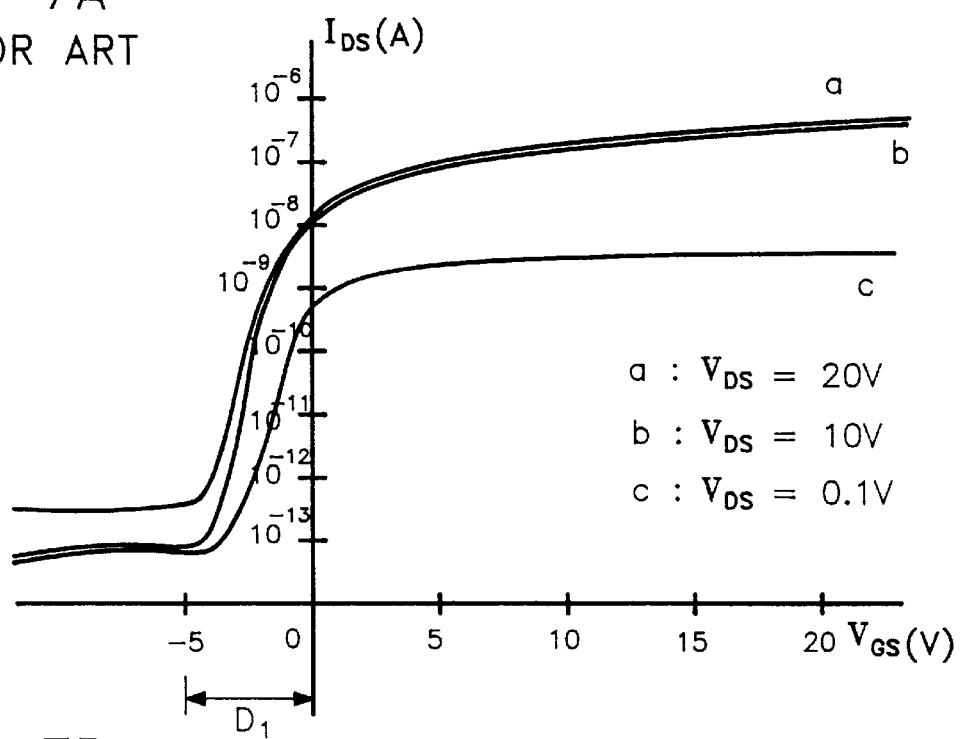
FIGS. 7A and 7B show the I–V characteristics of the TFT in a liquid crystal display having an organic material.
Figure 7B:
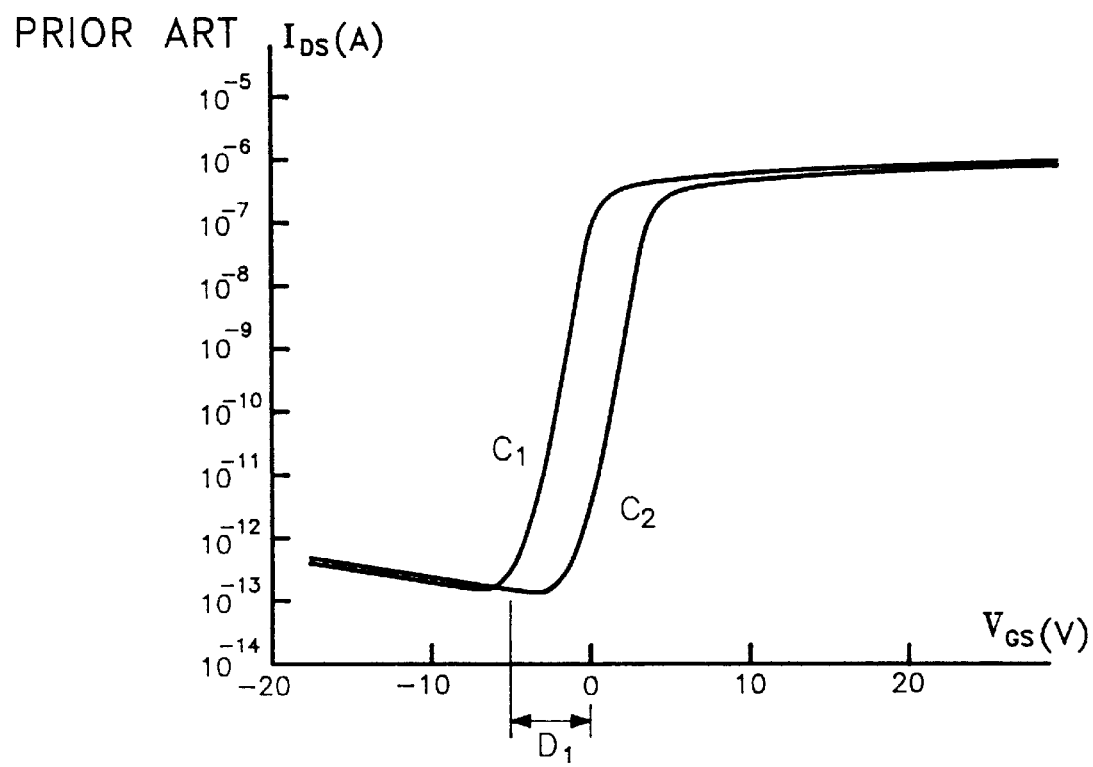

The first problem is detachment of the organic film from the semiconductor layer. The second problem is a charge trap phenomenon; traps for electric charges are created at the interface, causing unstable TFT characteristics. In general, it is desirable for the carriers to be electrons of negative charges rather than holes of positive charges, since a TFT for an LCD requires a fast response time. Therefore, a p-type or an intrinsic semiconductor is used for the channel layer and an n+impurity is used as the dopant to form the source or drain electrode. When a positive voltage is applied to the gate, electrons are induced in the semiconductor layer adjacent to the gate insulation layer and an n-type channel is formed. Then, electrons in the source electrode can move toward the drain electrode through the channel layer. Here, the source-drain current is determined by the gate voltage. On the other hand, when an organic material is used for the gate insulation layer, there are electron traps on the surface of the semiconductor layer due to free bond radicals between the organic material and the semiconductor material. This causes electrons to be trapped in the electron traps when an n-type channel is formed. These electrons remain on the surface of the semiconductor layer even when the applied voltage is released and the TFT is in the OFF state. Thus, when the TFT is turned on again, the TFT becomes the ON state even at a relatively low applied voltage due to the trapped electrons. Thus, the ON characteristic curve of the TFT moves toward the negative direction of the gate voltage (FIGS. 7A and 7B). Therefore, to eliminate such problems, a certain treatment is necessary for the interface between the organic material and the semiconductor layer.

Reference will now be made in detail to the preferred embodiments of the present invention, examples of which are illustrated in the accompanying drawings.

In the present invention, an organic material derived from benzocyclobutene (BCB) is selected for a gate insulation layer and/or protection film. BCB reveals superior properties to those of polyimide as shown in Table 1.

TABLE 1

Comparison of various properties between BCB and polyimide.

| Property | BCB | Polyimide |
|---|---|---|
| Dielectric constant | 2.7 | 3.4–3.8 |
| Intrinsic resistivity ($\Omega \cdot cm$) | $10^{19}$ | $10^{15}$ |
| Water contained (%) | 0.25 | 1.7 |
| Treatment temperture (° C.) | 200–250 | 350–400 |
| Compatibility to ITO | Good | Poor |

An organic material derived from PFCB can also be used for an LCD, which has superior properties of dielectric constant of 2.3 to 2.4 and the Degree of Planarization (DOP) of more than 90%. An organic material such as Fluorinated polyimide, Teflon, cytop, fluoropolyarylether, or Fluorinated para-xylene, all of which have a dielectric constant less than 3, may also be used for the manufacture of an LCD. Table 2 shows the specific dielectric constants of these materials.

TABLE 2

Dielectric Constant of organic materials used for an LCD in this invention.

| Organic material | Dielectric constant | Structure |
|---|---|---|
| Fluorinated polyimide | 2.7 | |
| Teflon | 2.1–1.9 | |
| Cytop | 2.1 | |
| BCB | 2.7 | |
| Fluoropolyarylether | 2.6 | |

TABLE 2-continued

Dielectric Constant of organic materials used for an LCD in this invention.

| Organic material | Dielectric constant | Structure |
| --- | --- | --- |
| Fluorinated parylene | 2.4 |  |

First Preferred Embodiment

Figure 10A:
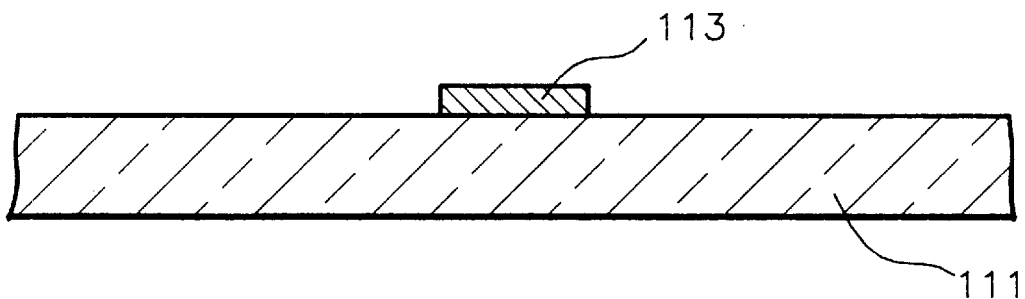
FIGS. 10A to 10G are cross-sectional views of a liquid crystal display using an inverse staggered type transistor according to a first embodiment of the present invention, taken along line II—II in FIG. 9.

Referring now to FIGS. 10A to 10G, the first preferred embodiment of the present invention will be described. A first metal, such as Cr. Ti, Al, Ti-Mo, Mo-Ta or Al-TA, is deposited on a transparent glass substrate 111 (1000 to 2000 Å thick). The film is patterned to form a gate bus line and a electrode 113 as shown in FIG. 10A. Then, the overall surface is coated with an organic material such as Fluorinated polyimide, Teflon, cytop, fluoropolyarylether, Fluorinated parylene, PFCB, or BCB to form a gate insulation layer 157 (about 4000 Å thick).

Figure 10B:
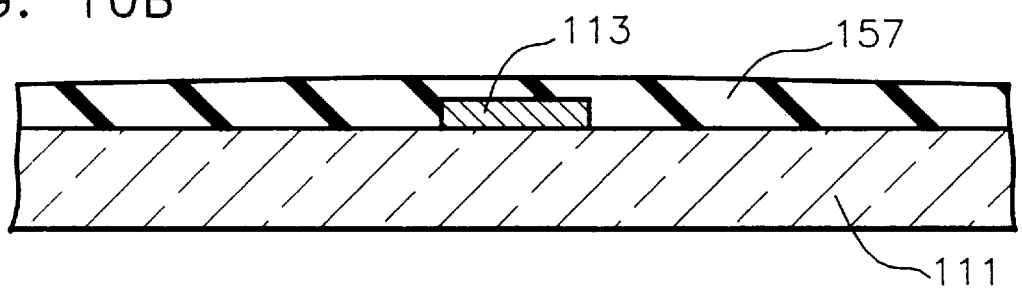

Here, the thickness of the organic film on the gate electrode 113 is about 2000 Å but that on the substrate is about 4000 Å as shown in FIG. 10B. As a result, the organic film has a smooth surface. Thus, problems such as line disconnection and/or short circuit, which arise during the deposition of a thin film on a stepped surface, can be prevented by this organic coating method of the present invention. Moreover, even though the gate insulation layer on the gate electrode is relatively thin, the organic insulation layer has a sufficient insulation property. This is because the resistivity of the organic material is higher than that of conventional inorganic materials for the gate insulation layer. On the other hand, the TFT cannot work efficiently if the dielectric constant of the gate insulation layer is so low that field effect of the TFT does not occur properly. However, the application of the organic film rather than an inorganic film on a gate electrode does not affect the function of a TFT. This is because the thickness of the organic film on the TFT is reduced to compensate the low dielectric constant of the organic film.

Figure 10C:
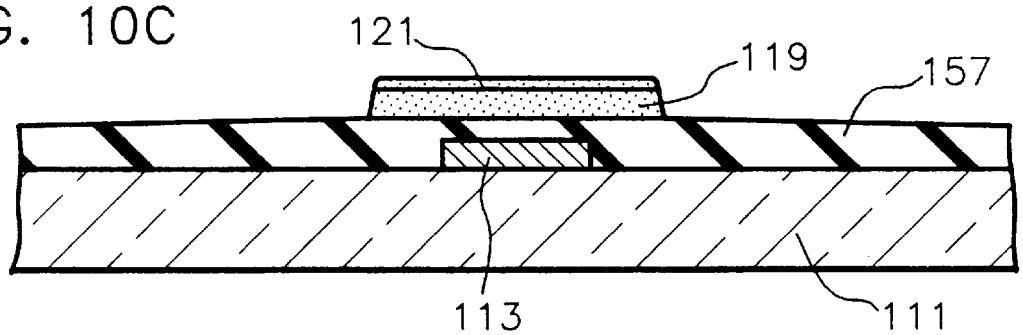
Figure 10D:
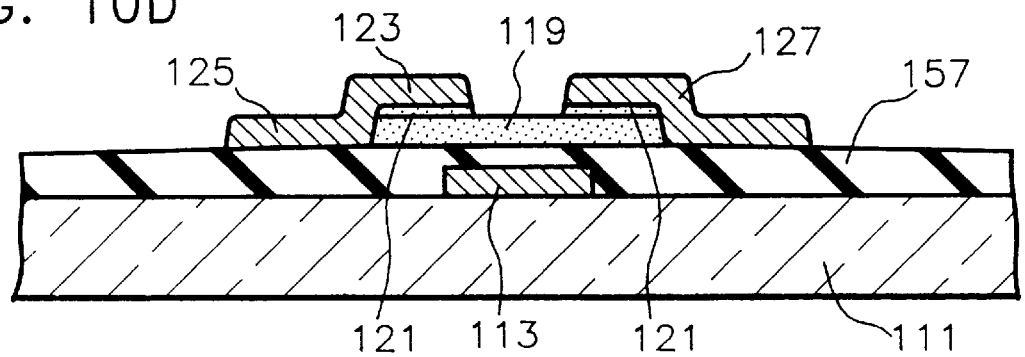
Figure 10E:
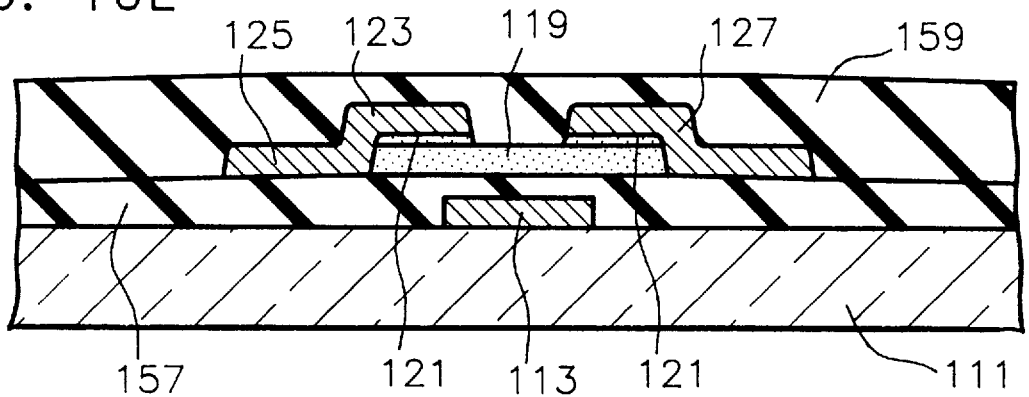
Figure 10F:
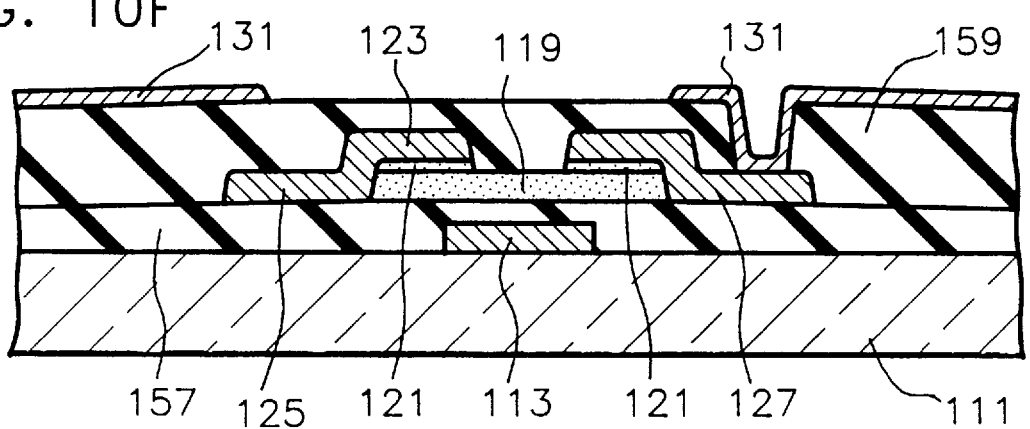

Next, an amorphous semiconductor material and an impurity-doped semiconductor material are deposited on the gate insulation layer 157 and patterned to form a semiconductor layer 119 and an impurity-doped semiconductor layer 121 (FIG. 10C). Then, a second metal, such as Cr, Mo, Ti, Cr alloy, or Al alloy, is deposited on the impurity-doped semiconductor layer 121 and patterned to form a signal bus line 125, a source electrode 123, and a drain electrode 127. The exposed portion of the impurity-doped semiconductor layer 121 is then removed (FIG. 10D) by using the patterned electrodes (123 and 127) as a mask. Here, the source and drain electrodes make an ohmic contact with the impurity-doped semiconductor layer 121. Subsequently, a protection film 159 is deposited on the overall surface as shown in FIG. 10E. The protection film is made of an organic material such as Fluorinated polyimide, Teflon, cytop, fluoropolyarylether, Fluorinated parylene, PFCB, or BCB. A contact hole is formed in the protection film over the drain electrode 127. Then, an ITO is deposited on the overall surface and patterned to form a pixel electrode 131, which is in contact with the drain electrode 127 through the hole, as shown in FIG. 10F.

Figure 8:
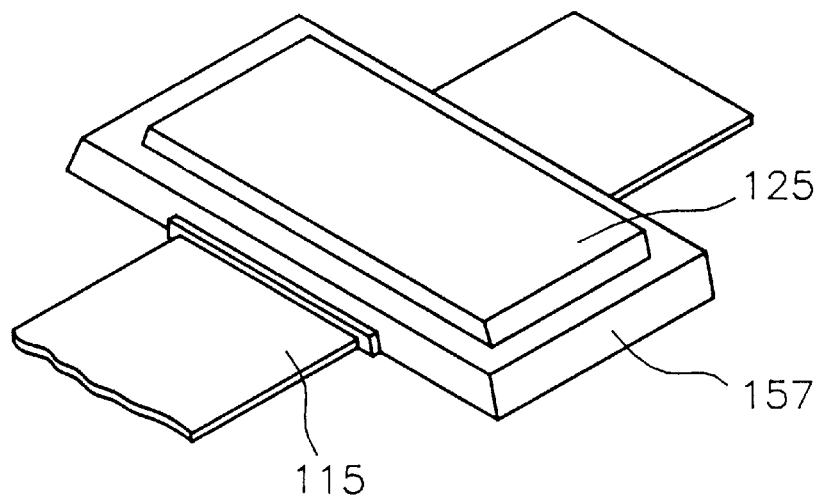
FIG. 8 is a perspective view showing a multilayer structure of thin films for a liquid crystal display using an organic material according to the present invention.
Figure 9:
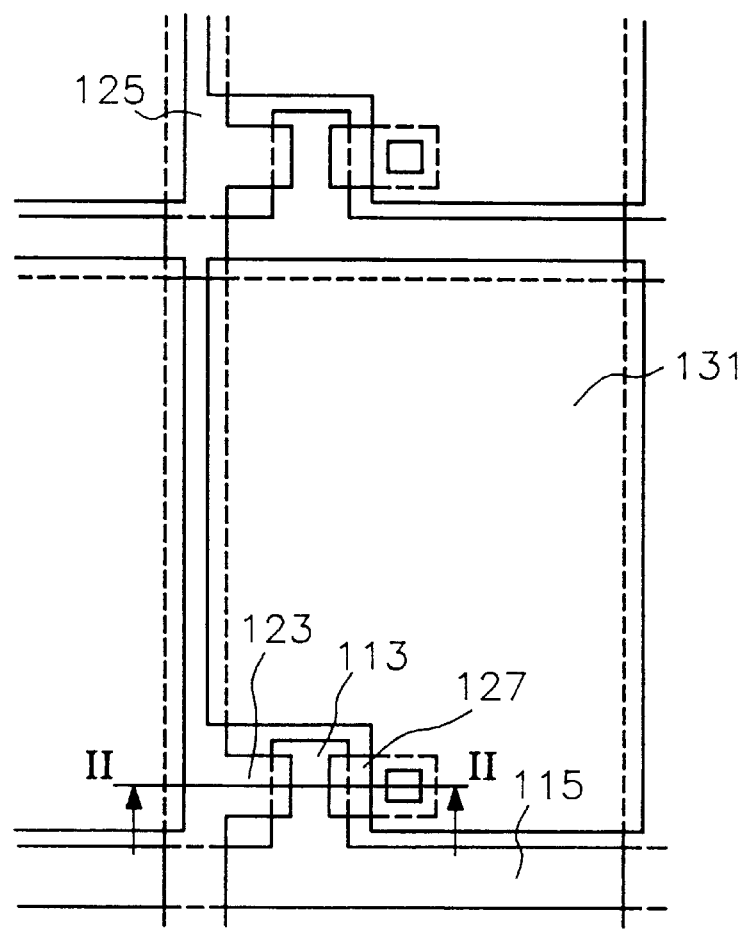
FIG. 9 is a plan view of a liquid crystal display according to the present invention.

FIG. 8 is a perspective view of the intersection between gate and signal bus lines. When the gate insulation layer 157 is coated on the gate bus line 115, and the signal bus line 125 is deposited on the gate insulation layer 157, the stepped profile due to the gate bus line 115 is not reflected on the surface of the gate insulation layer 157. When the insulation layer is made of an organic material, the resultant surface becomes smooth and tempers the stepped profile due to the gate bus lines 115. Thus, the pixel electrode formed on the protection film does not have any short circuit, even when it is formed to overlap signal bus lines or gate bus lines. Moreover, due to the low dielectric constant of the organic material, the method does not require spaces or gaps between pixel electrodes and gate and signal bus lines. Consequently, as shown in FIG. 9, it is possible to form a wider pixel electrode than that in a conventional method. This yields an improved aperture ratio. The aperture ratio can be improved by as much as 80%. Therefore, a high quality contrast can be achieved without a light shielding film.

Figure 10G:
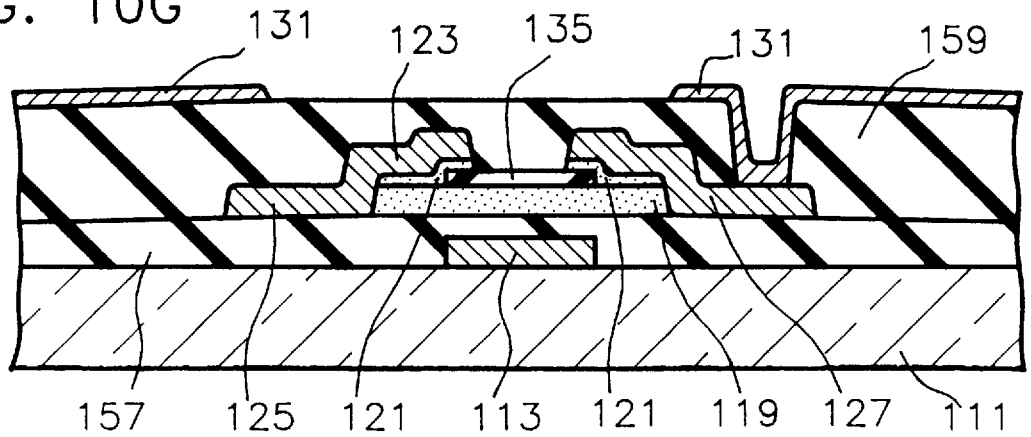

In the manufacture of an LCD described above, the impurity-doped semiconductor layer is removed during the etching process of the source and drain electrodes. During the etching process of the impurity-doped semiconductor layer, the semiconductor layer may also be etched undesirably. An etch stopper layer 135 of an inorganic material may be formed on the semiconductor layer in order to prevent such an over-etching (FIG. 10G). This introduces an additional stepped shape in the TFT structure. In this case, the application of an organic material as a protection film is also advantageous. The TFT having the structure similar to this embodiment is referred to as an inverse, staggered TFT.

Second Preferred Embodiment

Figure 11A:
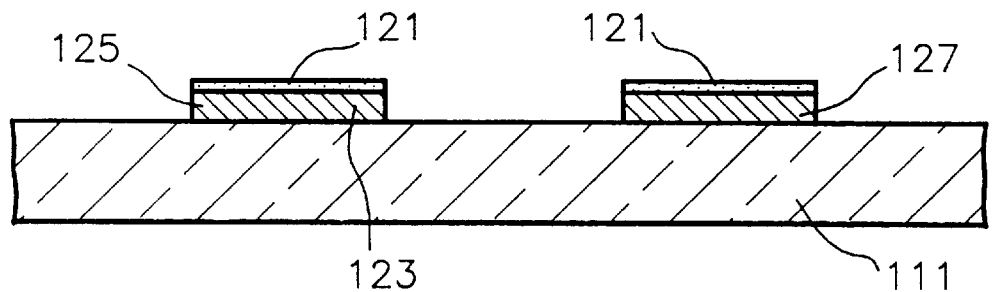
FIGS. 11A to 11F are cross-sectional views of a liquid crystal display using a staggered type transistor according to a second embodiment of the present invention, taken along line II—II in FIG. 9.
Figure 11B:
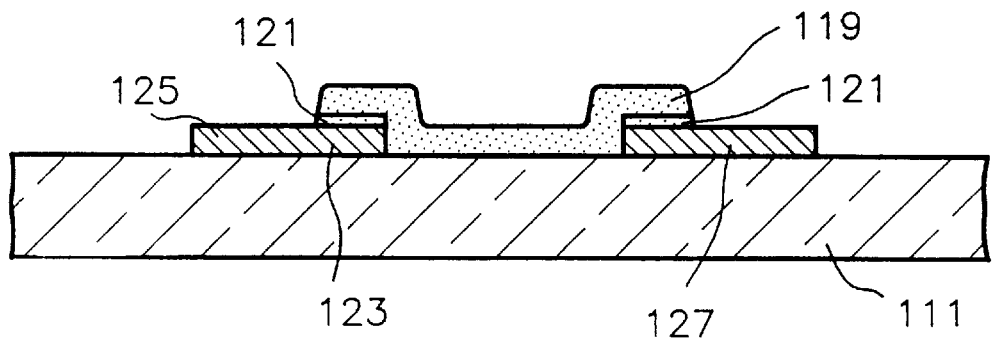
Figure 11C:
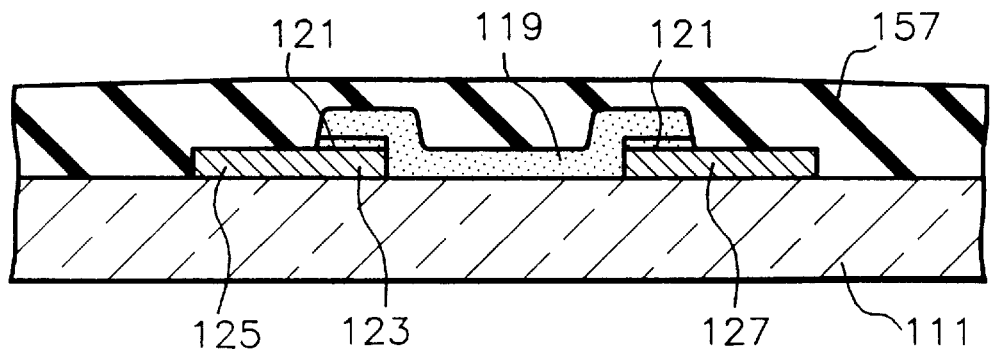
Figure 11D:
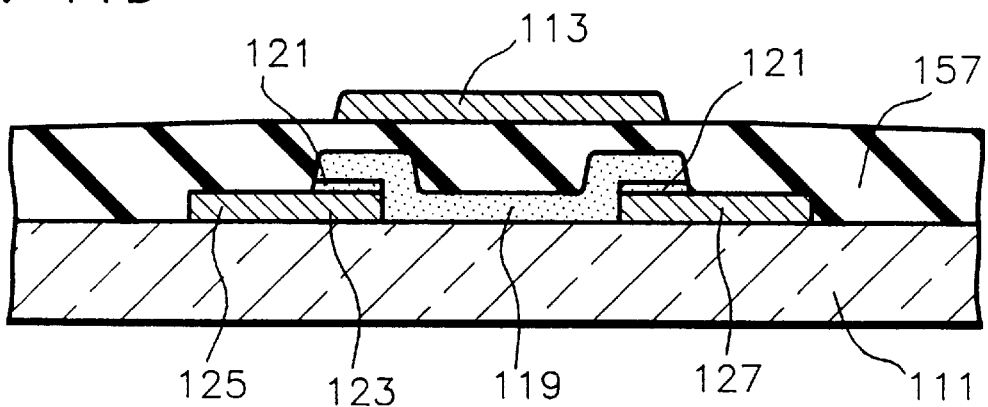

Referring now to FIGS. 11A to 11F, the second preferred embodiment of the present invention will be described. A metal such as Cr, Mo, Ti, Cr alloy, or Al alloy is deposited on a transparent glass substrate 111, followed by the deposition of an impurity-doped amorphous semiconductor material. The resultant two films are patterned together to form a signal bus line 125, a source electrode 123, a drain electrode 127, and an impurity-doped semiconductor layer 121, as shown in FIG. 11A. Here, the impurity-doped semiconductor layer 121 makes an ohmic contact with the source and drain electrodes. Then, a semiconductor is deposited and patterned to form a semiconductor layer 119. The exposed portions of the impurity-doped semiconductor layer 121 which are not covered by the semiconductor layer 119 are also removed as shown in FIG. 11B. Next, an organic material such as Fluorinated polyimide, Teflon, cytop, fluoropolyarylether, Fluorinated parylene, PFCB, or BCB is coated on the overall surface to form a gate insulation layer 157. The use of an organic material with a high planarization property results in a smooth surface on the insulation layer as shown in FIG 1C.

Figure 1:
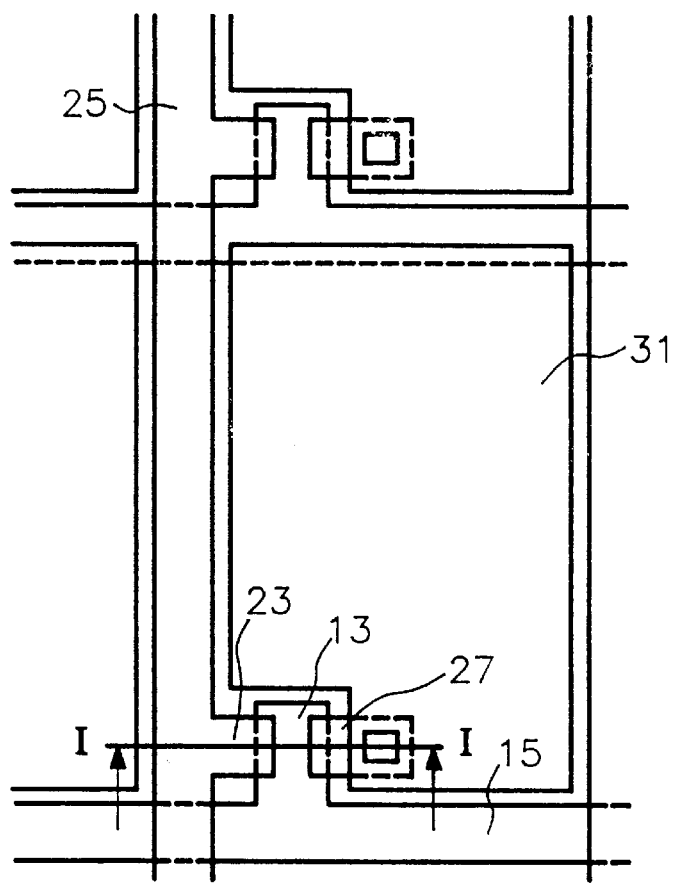
FIG. 1 is a plan view of a conventional liquid crystal display.
Figure 6:
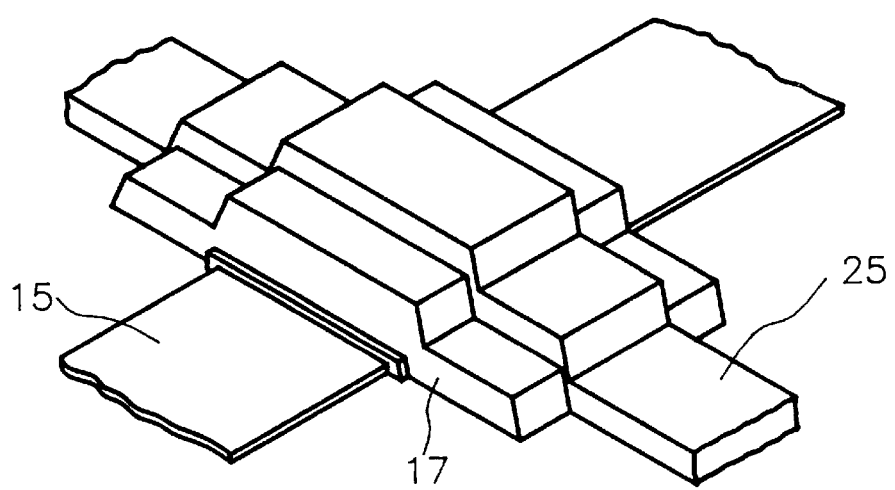
FIG. 6 is a perspective view showing a multilayer structure of thin films for a conventional liquid crystal display.
Figure 2A:
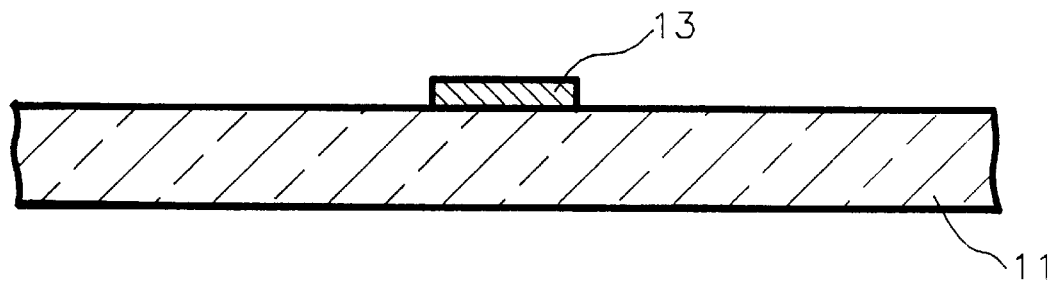
FIGS. 2A to 2F are cross-sectional views of an inverse staggered type thin film transistor for a conventional liquid crystal display, taken along line I—I in FIG. 1.
Figure 2B:
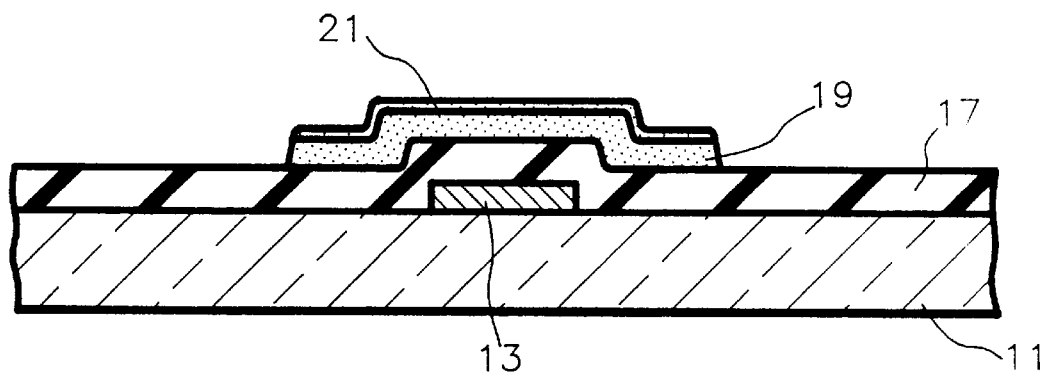
Figure 2C:
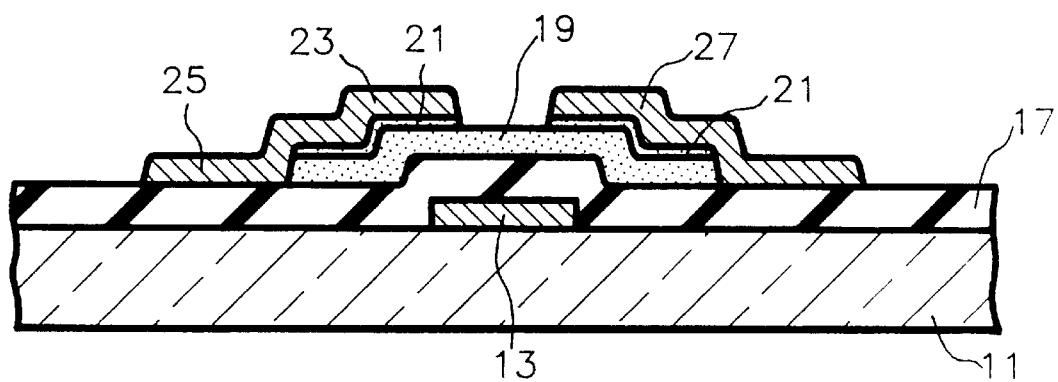
Figure 2D:
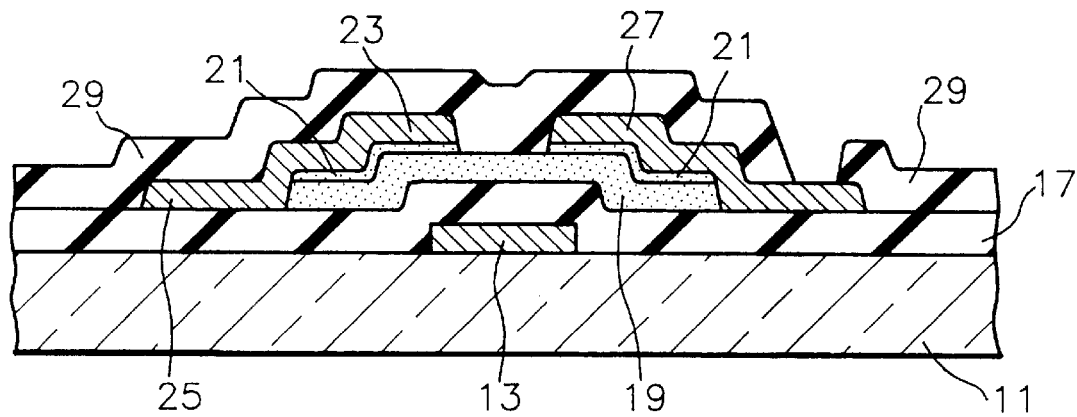
Figure 2E:
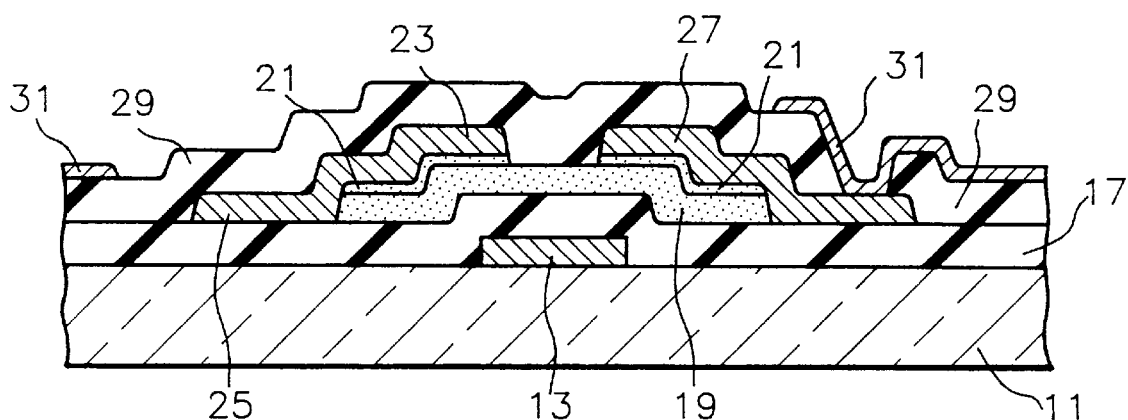
Figure 2F:
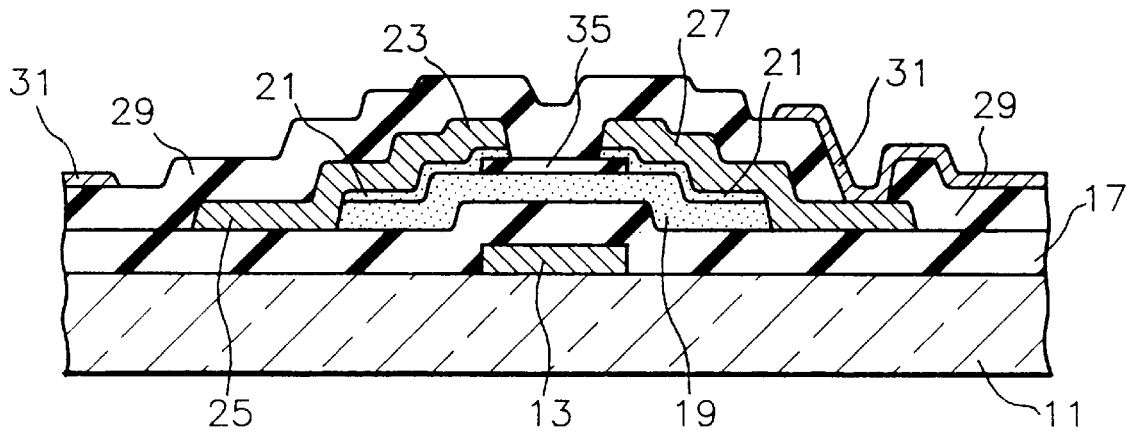
Figure 3A:
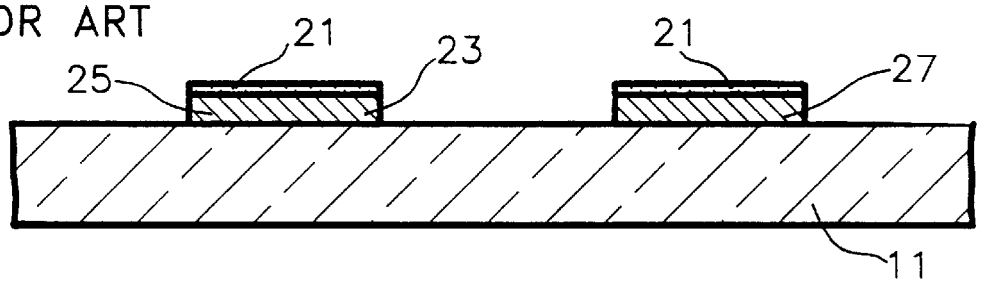
FIGS. 3A to 3D are cross-sectional views of a staggered type thin film transistor for a conventional liquid crystal display, taken along line I—I in FIG. 1.
Figure 3B:
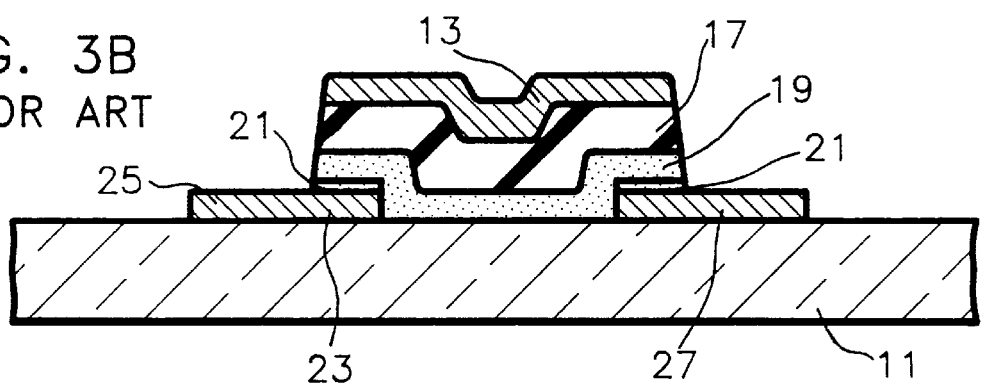
Figure 3C:
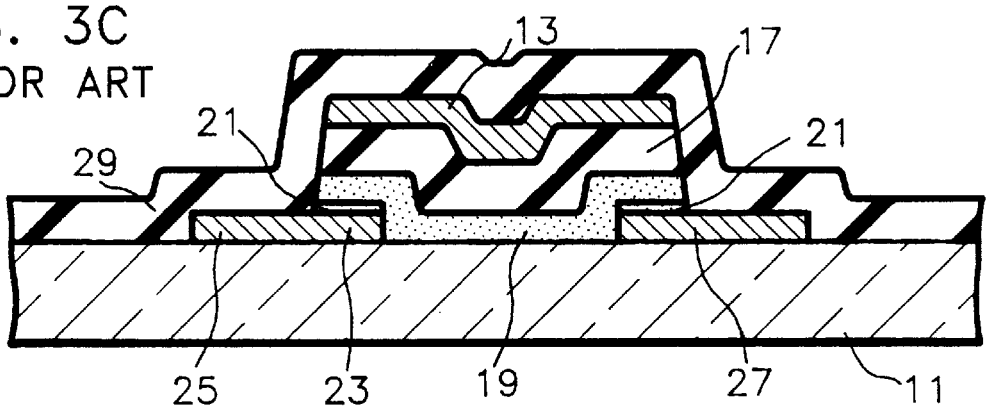
Figure 3D:
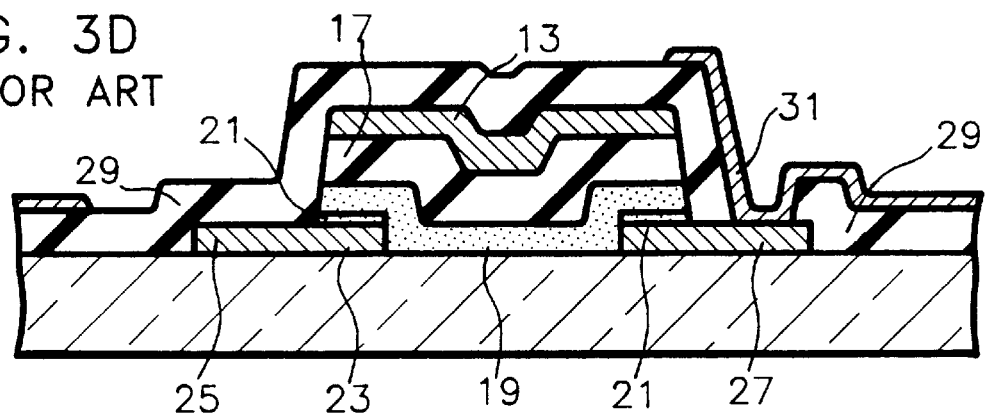
Figure 4A:
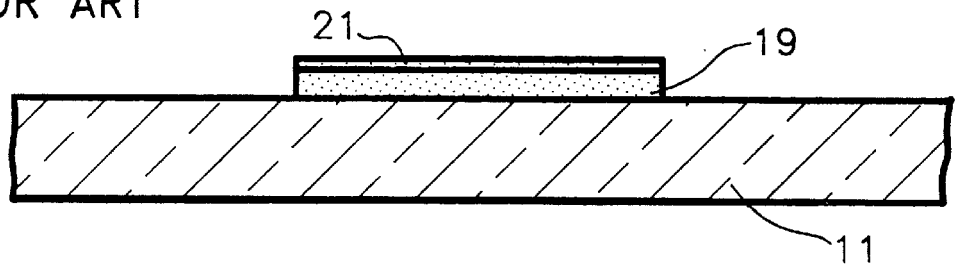
FIGS. 4A to 4D are cross-sectional views of a coplanar type thin film transistor for a conventional liquid crystal display, taken along line I—I in FIG. 1.
Figure 4B:
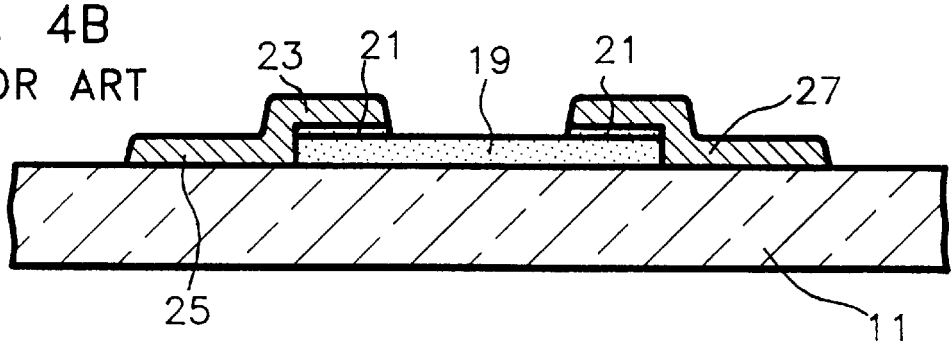
Figure 4C:
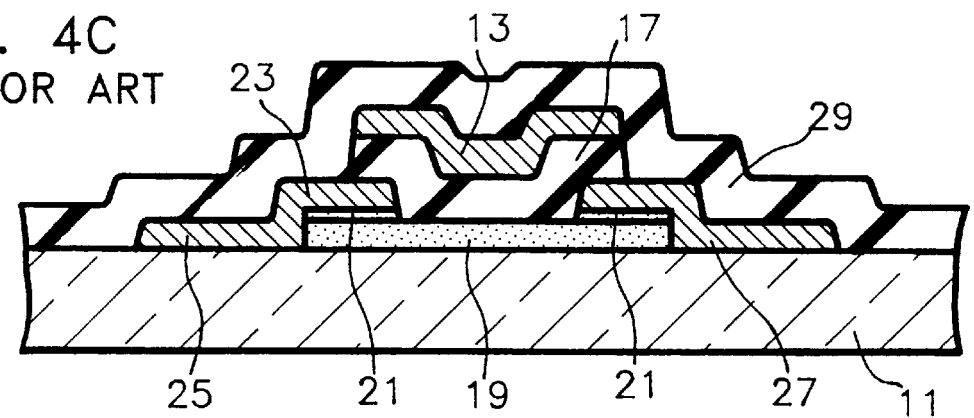
Figure 4D:
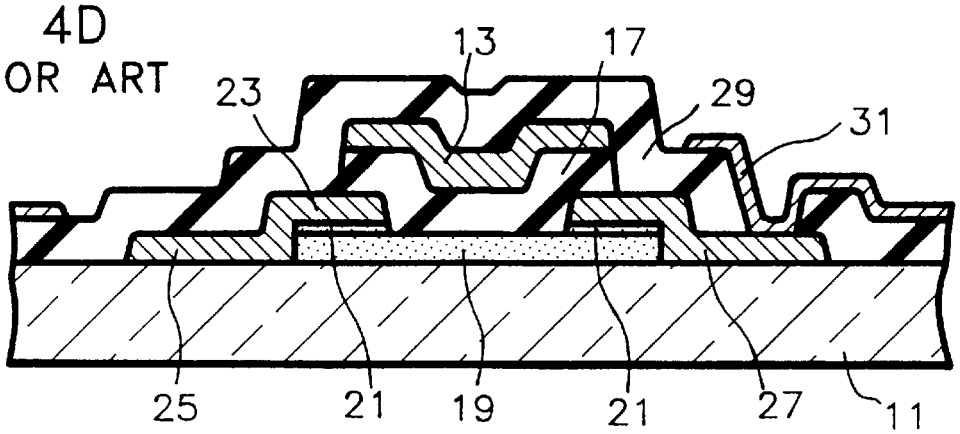
Figure 5A:
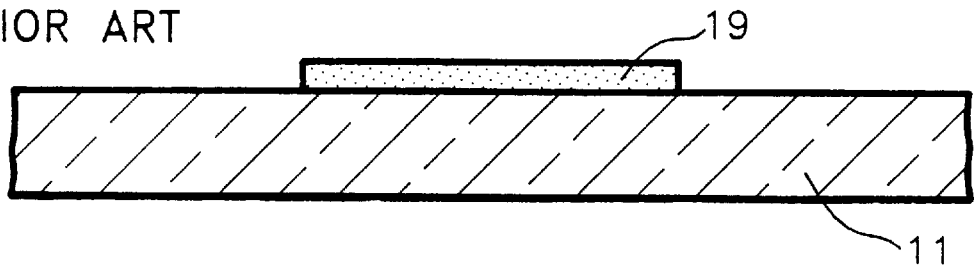
FIGS. 5A to 5G are cross-sectional views of a self-aligned type thin film transistor for a conventional liquid crystal display, taken along line I—I in FIG. 1.
Figure 5B:
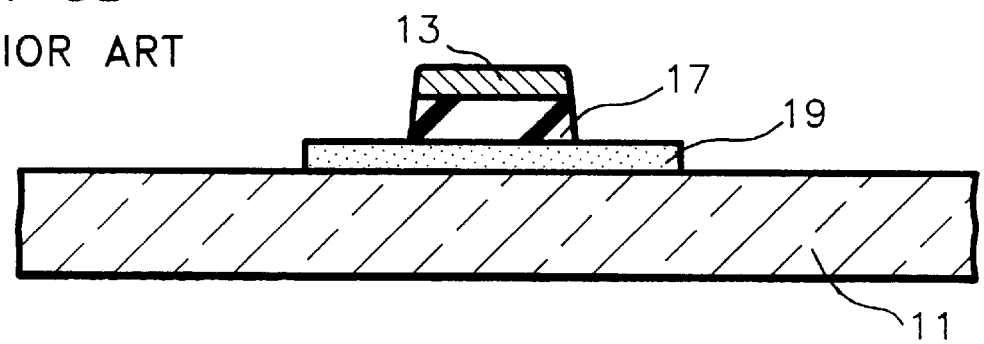
Figure 5C:
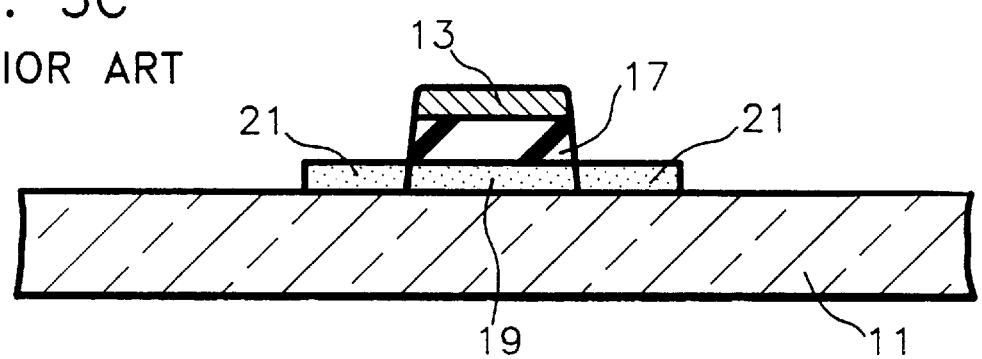
Figure 5D:
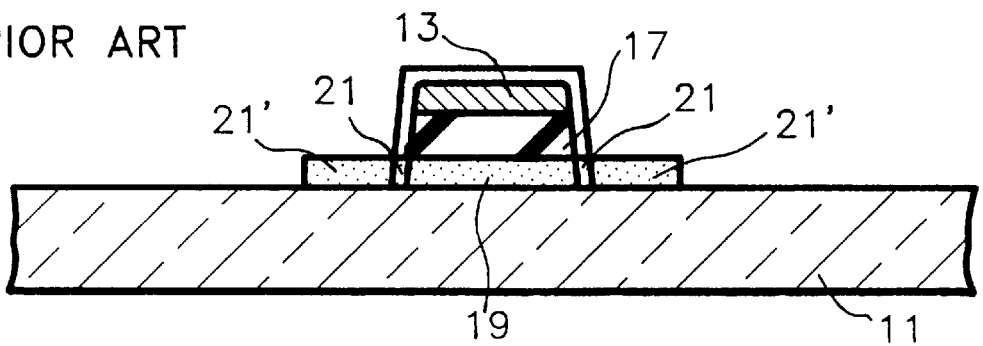
Figure 5E:
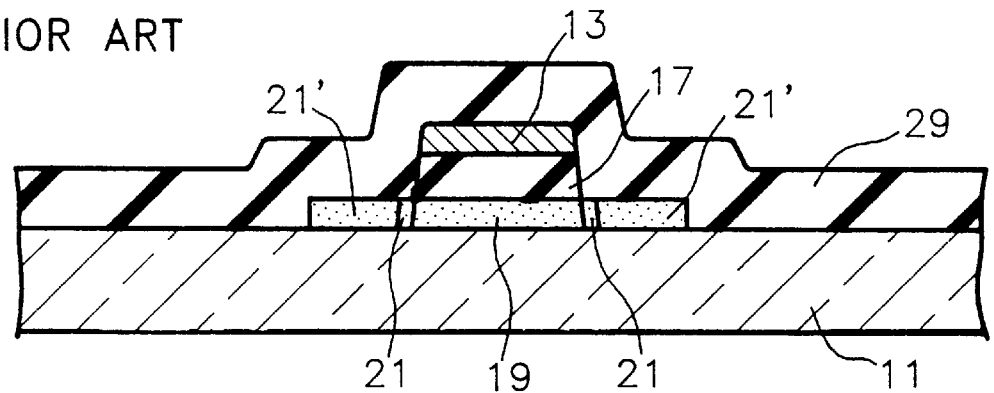
Figure 5F:
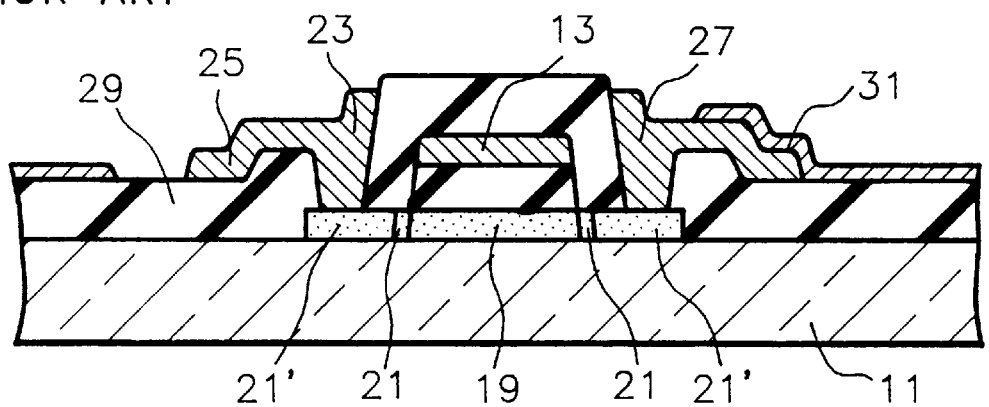
Figure 5G:
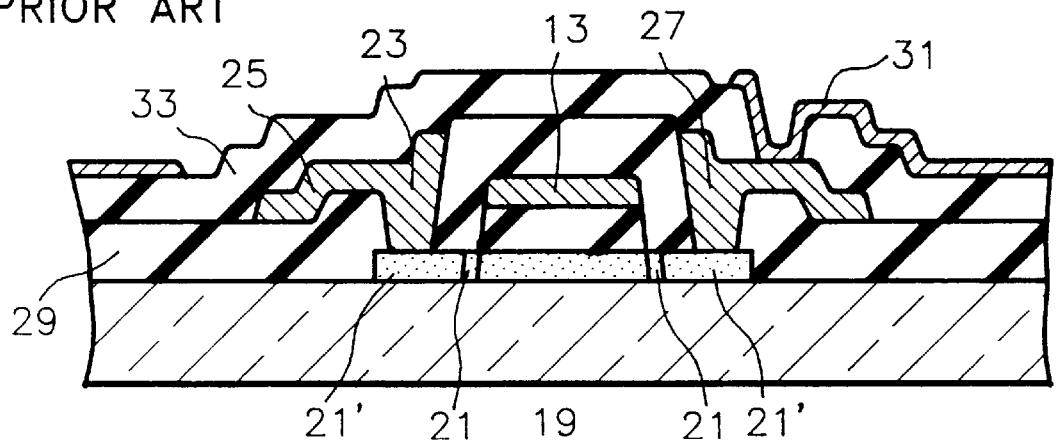
Figure 11E:
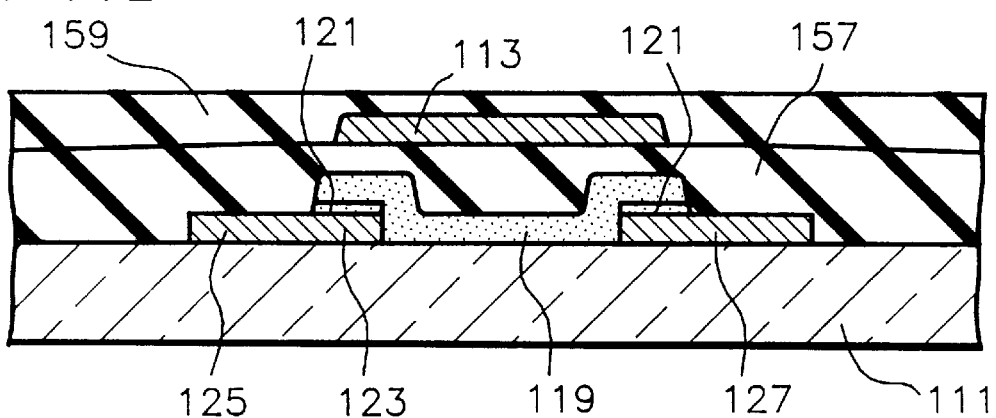
Figure 11F:
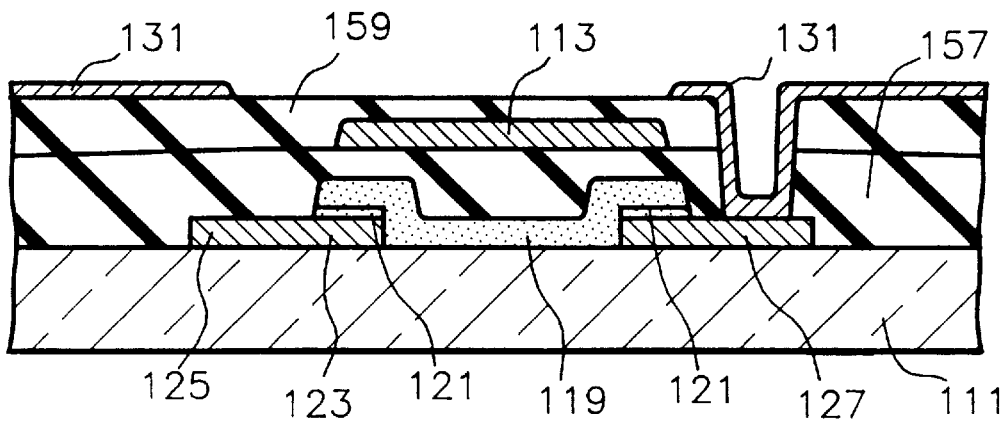

Next, a second metal such as Cr, Ti, Ta, Al, Ti-Mo, Mo-Ta, or Al alloy is deposited on the gate insulation layer 157 and patterned to form a gate bus line and a gate electrode 113, as shown in FIG. 1D. An organic material such as Fluorinated polyimide, Teflon, cytop, fluoropolyarylether, Fluorinated parylene, PFCB, or BCB is coated on the overall surface to form a protection film 159, as shown in FIG. 11E. A contact hole is formed in the protection and insulation layers over the drain electrode 127. Then, ITO is deposited and patterned to form a pixel electrode 131, as shown in FIG. 11F. The TFT having the structure similar to this embodiment is referred to as a staggered TFT.

Third Preferred Embodiment

Figure 12A:
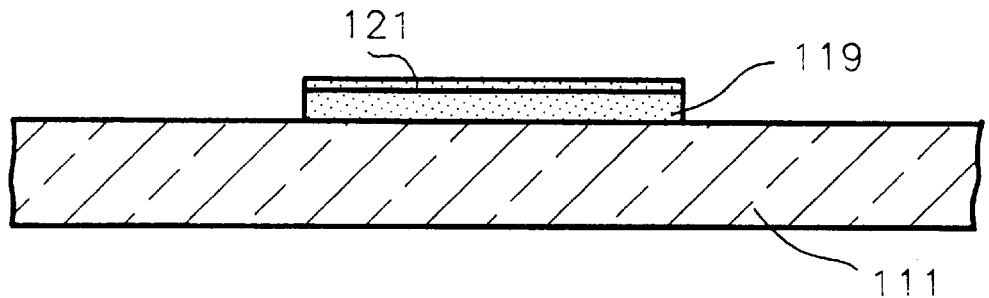
FIGS. 12A to 12F are cross-sectional views of a liquid crystal display using a coplanar type transistor according to a third embodiment of the present invention, taken along line II—II in FIG. 9.
Figure 12B:
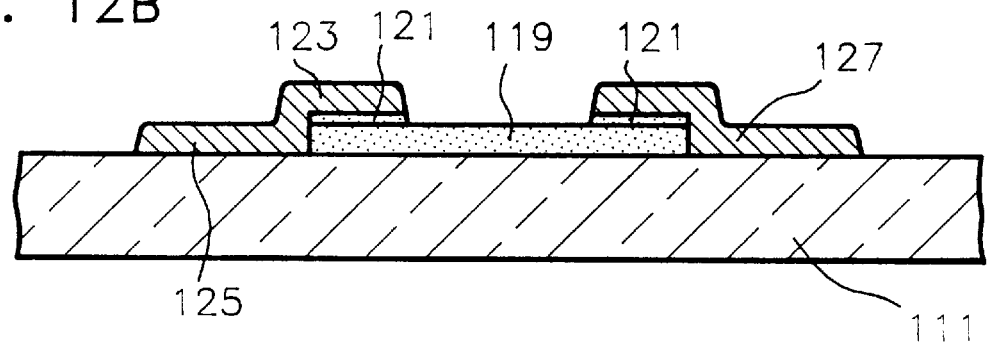
Figure 12C:
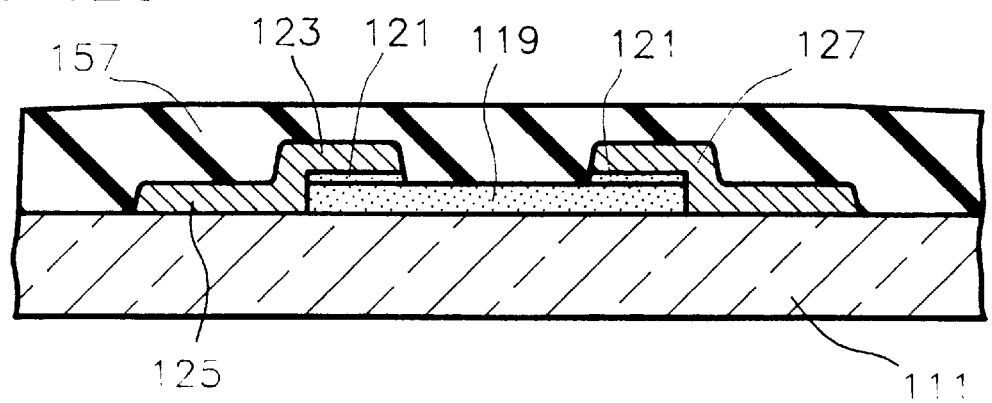

Referring now to FIGS. 12A to 12F, the third preferred embodiment of the present invention will be described. A polycrystalline intrinsic semiconductor is deposited on a transparent substrate 111, followed by deposition of an impurity-doped semiconductor material. The resultant two films are patterned together to form a semiconductor layer 119 and an impurity-doped semiconductor layer 121, as shown in FIG. 12A. Subsequently, a first metal, such as Cr, Mo, Ti, or Cr-Al, is deposited and patterned to form a signal bus line 125, a source electrode 123, and a drain electrode 127. Then, the exposed portion of the impurity-doped semiconductor layer 121 is removed using the source and drain electrodes as a mask (FIG. 12B). The impurity-doped semiconductor layer 121 makes an ohmic contact with the source and drain electrodes. Next, an organic material such as Fluorinated polyimide, Teflon, cytop, fluoropolyarylether, Fluorinated parylene, PFCB, or BCB is coated on the overall surface to form a gate insulation layer 157, as shown in FIG. 12C.

Figure 12D:
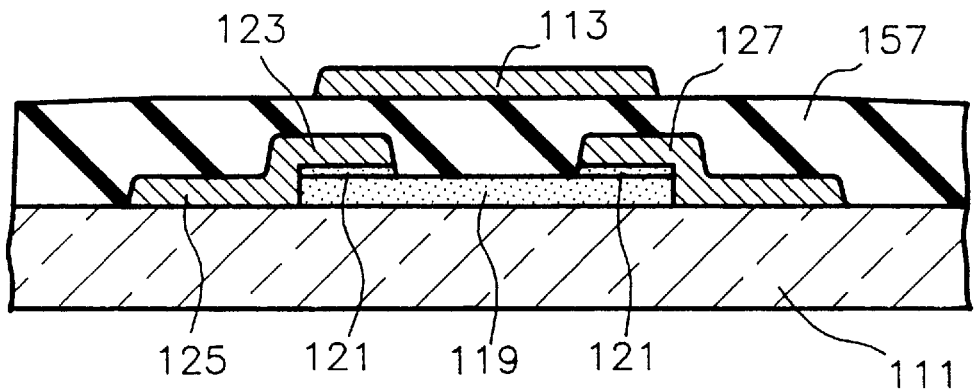
Figure 12E:
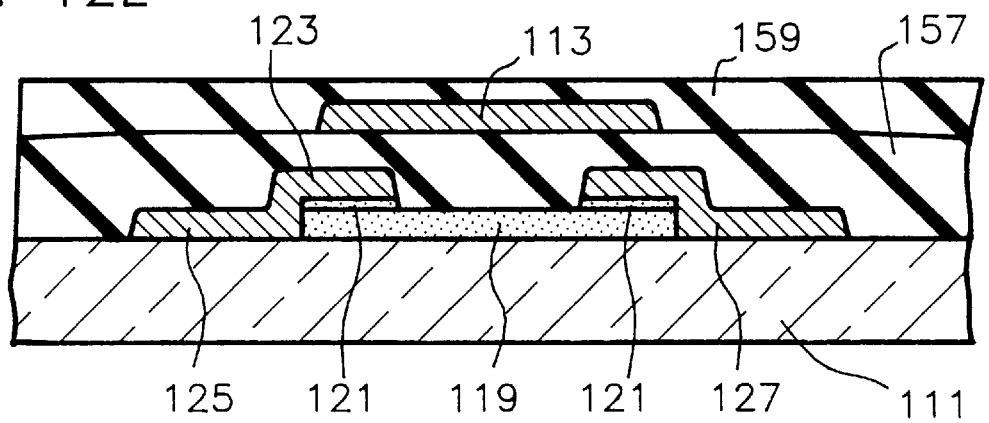
Figure 12F:
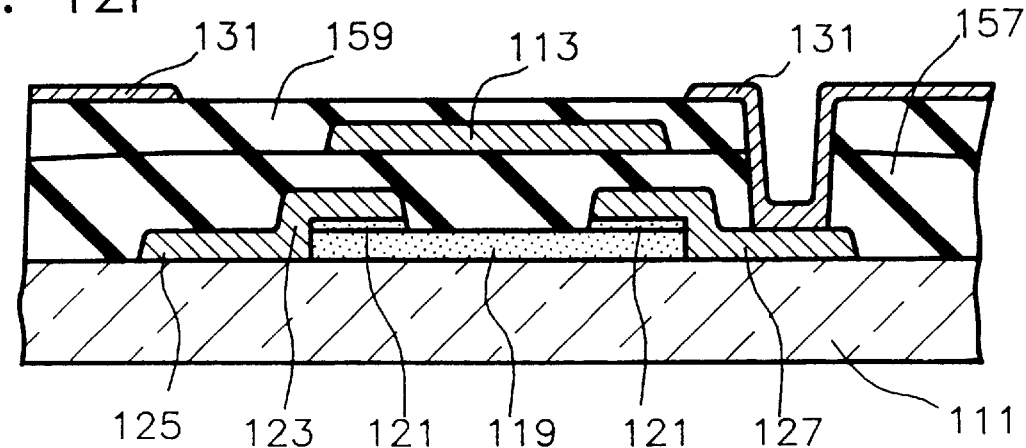

A second metal such as Cr, Ti, Ta, Al, Ti-Mo, or Al-Ta is deposited on the gate insulation layer 157 and patterned to form a gate bus line and a gate electrode 113, as shown in FIG. 12D. Here, the gate insulation layer 157 may be etched to be the same pattern as the gate electrode. Next, an organic material such as Fluorinated polyimide, Teflon, cytop, fluoropolyarylether, Fluorinated parylene, PFCB, or BCB is coated on the overall surface to form a protection film 159, as shown in FIG. 12E. A contact hole is formed in the protection film 159 and the gate insulation layer 157 over the drain electrode 127. Then, ITO is deposited and patterned to form a pixel electrode 131, as shown in FIG. 12F. The pixel electrode 131 is electrically connected to the drain electrode 127 through the contact hole. The TFT having the structure similar to this embodiment is referred to as a coplanar TFT.

Fourth Preferred Embodiment

Figure 13A:
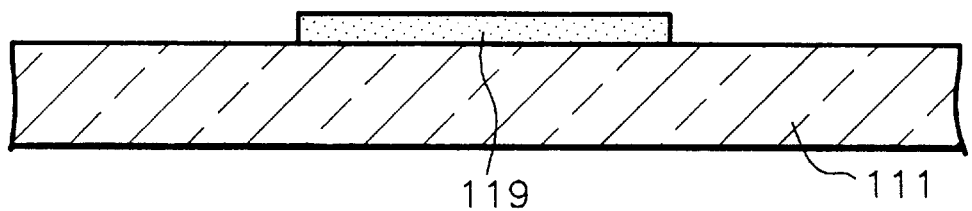
FIGS. 13A to 13G are cross-sectional views of a liquid crystal display using a self-aligned type transistor according to a fourth embodiment of the present invention, taken along line II—II in FIG. 9.
Figure 13B:
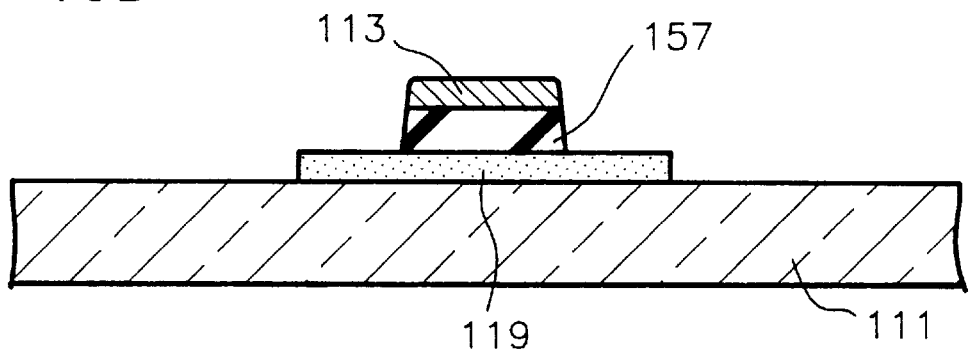
Figure 13C:
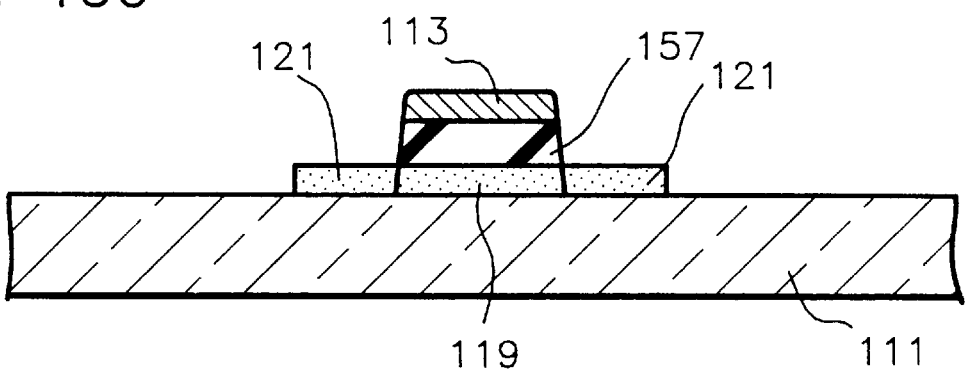
Figure 13D:
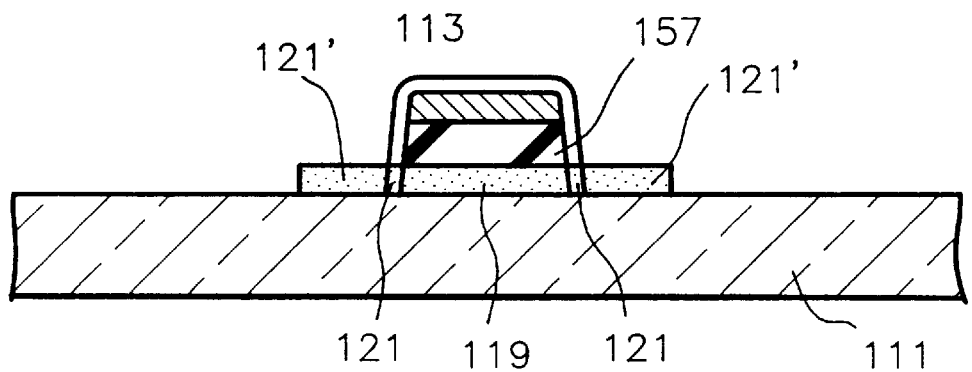

Referring now to FIGS. 13A to 13G, the fourth preferred embodiment of the present invention will be described. A polycrystalline semiconductor material is deposited on a transparent substrate 111 and patterned to form a semiconductor layer 119, as shown in FIG. 13A. In general, there are three methods to form the polycrystalline semiconductor layer. First, a polycrystalline silicon is formed by depositing an amorphous silicon and annealing it by laser. Second, a polycrystalline silicon is formed by depositing an amorphous silicon and thermally annealing it. Third, a polycrystalline silicon material is directly deposited. Next, an organic material such as Fluorinated polyimide, Teflon, cytop, fluoropolyarylether, Fluorinated par-xylene, PFCB, or BCB is coated on the overall surface to form a gate insulation layer 157. Then, a first metal such as Cr, Ti, Ta, Al, Ti-Mo, Mo-Ta, or Al alloy is deposited on the insulation layer and patterned to form a gate bus line and a gate electrode 113, as shown in FIG. 13B. The gate electrode is formed to be located at about the center of the semiconductor layer 119. The two edge portions of the semiconductor layer are formed into a first impurity-doped semiconductor layer 121 by injecting impurity-ions into the semiconductor layer 119 using the gate electrode 113 as a mask (impurity concentration of $10^{16}$ to $10^{18}$ cm$^{-3}$)(FIG. 13C). Then, a photoresist is coated over a certain portion of the first impurity-doped semiconductor layer 121. A second impurity-doped semiconductor layer 121' is then formed by injecting impurity-ion (impurity concentration of $10^{19}$ to $10^{21}$ cm$^{-3}$). The part covered by the photoresist is the LDD part with injected impurity-ions having lower density (FIG. 13D).

Alternatively, the step described referring to FIG. 13C may be omitted. In this case, after a photoresist is coated to cover a certain part of the semiconductor layer 119, an impurity-doped semiconductor layer 121' is formed by injecting impurity-ions (impurity concentration of $10^{19}$ to $10^{21}$ cm$^{-3}$). Here, the part covered by the photoresist becomes an offset part.

Figure 13E:
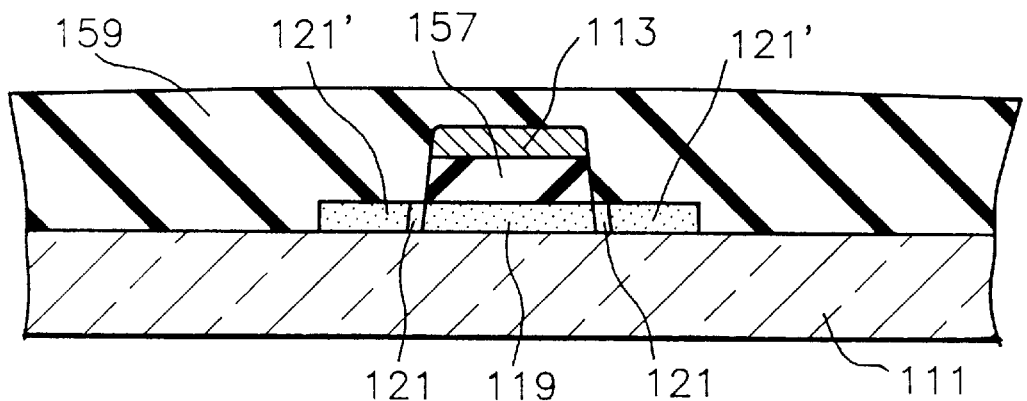
Figure 13F:
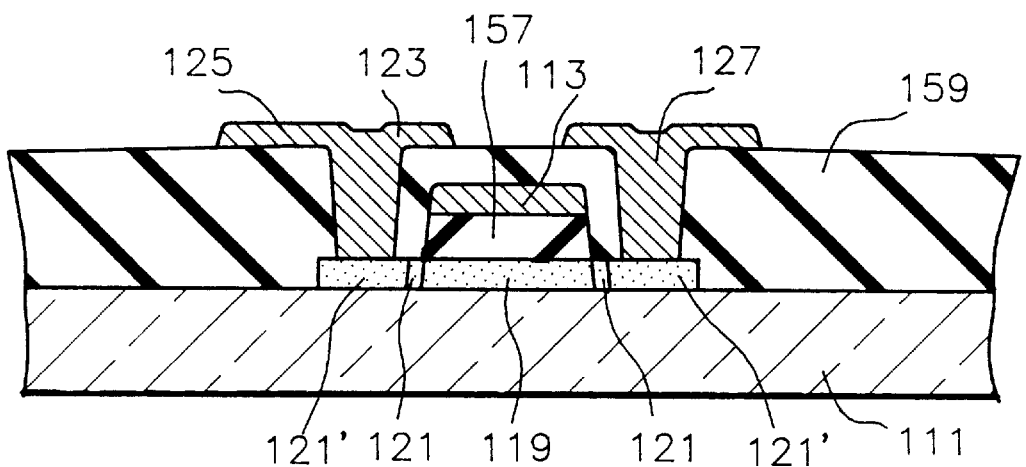
Figure 13G:
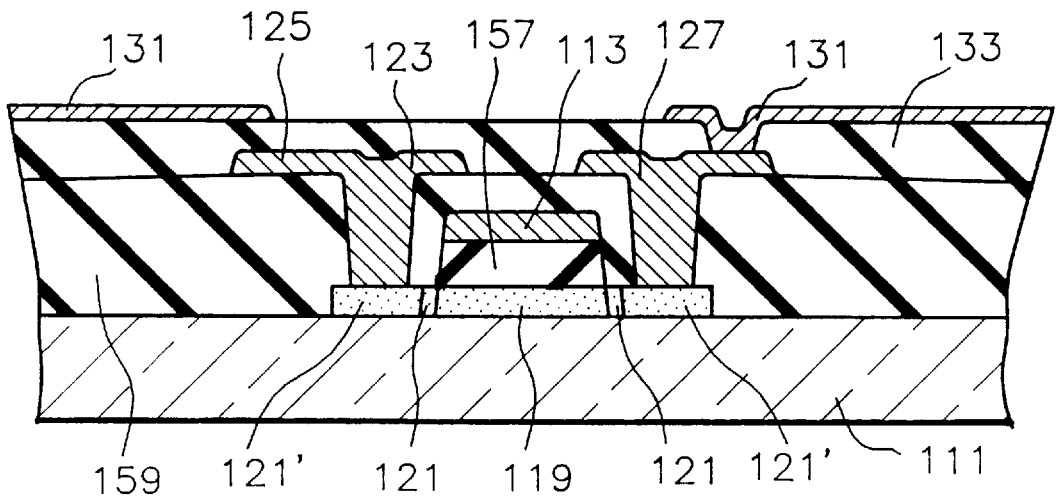

Next, an organic material such as Fluorinated polyimide, Teflon, cytop, fluoropolyarylether, Fluorinated parylene, PFCB, or BCB is coated on the overall surface to form a protection film 159, as shown in FIG. 13E. First contact holes are formed in the protection film 159 over the second impurity-doped semiconductor layer 121'. Then, a second metal such as Cr, Mo, Ti, or Cr-Al is deposited and patterned to form a source electrode 123, a drain electrode 127, and a signal bus line 125, as shown in FIG. 13F. An organic material such as Fluorinated polyimide, Teflon, cytop, fluoropolyarylether, Fluorinated parylene, PFCB, or BCB is coated on the overall surface to form a second protection film 133. ITO is deposited and patterned to form a pixel electrode 131 as shown in FIG. 13G. The pixel electrode 131 is electrically connected to the drain electrode 127 through a second contact hole formed in the second protection film 133. The TFT having the structure similar to this embodiment is referred to as a self-aligned TFT.

Fifth Preferred Embodiment

In the above-mentioned first to fourth embodiments, an organic gate insulation layer 157 and/or an organic protection film 159 is in contact with a semiconductor layer 119. In that circumstance, problems such as detachment and charge trap may occur. To solve this problem, an inorganic layer such as silicone oxide or silicone nitride is formed between the semiconductor layer and the organic film. The inorganic materials are deposited by, for example, CVD. This embodiment introduces this inorganic layer in the above-mentioned four embodiments.

Figure 14A:
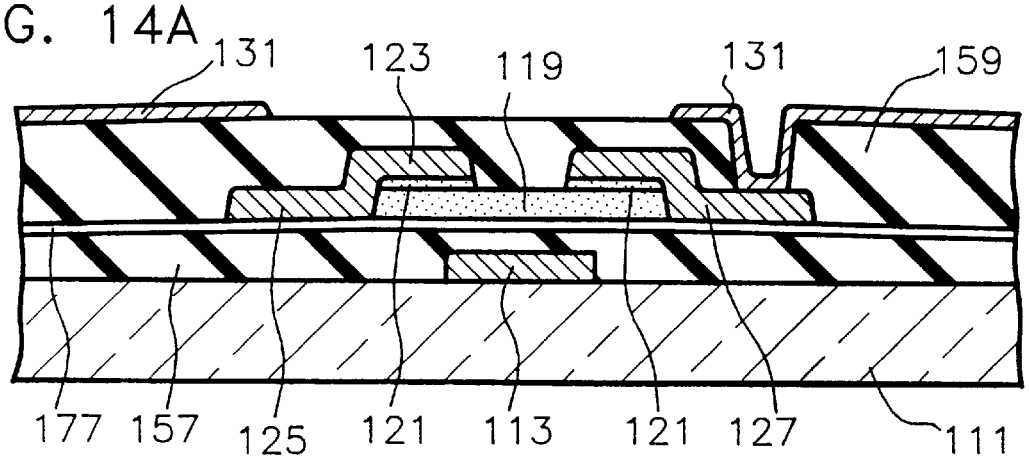
FIGS. 14A to 14G are cross-sectional views of various thin film transistors for a liquid crystal display according to a fifth embodiment of the present invention.

FIGS. 14A to 14D show the cases of manufacturing an inverse staggered TFT. After forming a gate insulation layer 157 of an organic material, a first inorganic film 177 is formed by depositing silicone oxide or silicone nitride, for example, prior to the deposition of a semiconductor layer 119. This eliminates problems such as detachment and electron trap which could occur at the interface between the gate insulation layer 157 and the semiconductor layer 119, as shown in FIG. 14A.

Figure 14B:
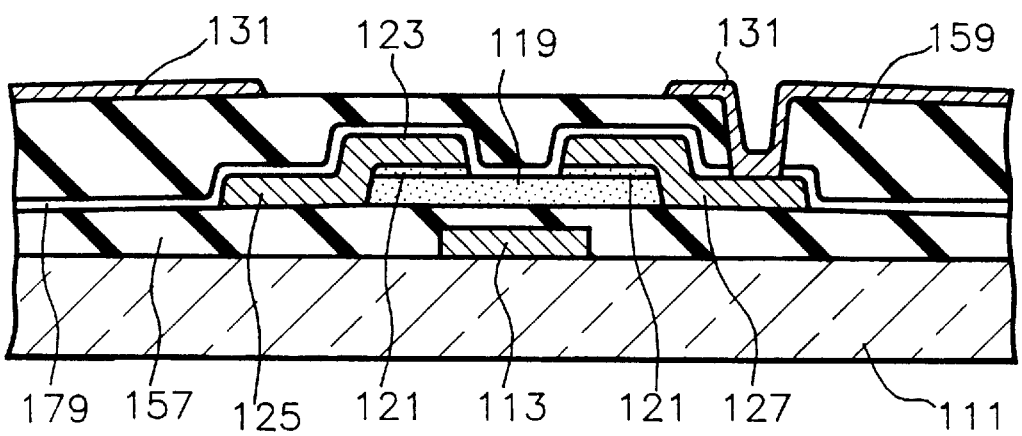
Figure 14C:
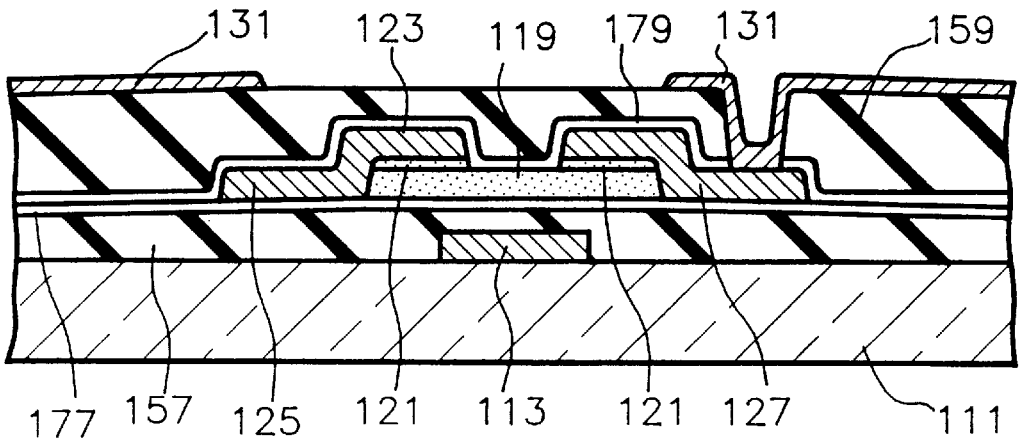

Alternatively, after forming the source electrode 123 and the drain electrode 127, a second organic film 179 is deposited prior to a formation of an organic protection film 159 (FIG. 14B). In this case, problems such as detachment and charge trap, which could arise at the interface between a semiconductor layer and organic protection film, can be prevented. Moreover, when both the gate insulation layer 157 and the protection film 159 are formed by organic materials, it is evident that a better result can be obtained by forming both the first and second inorganic films 177 and 179 (FIG. 14C).

Figure 14D:
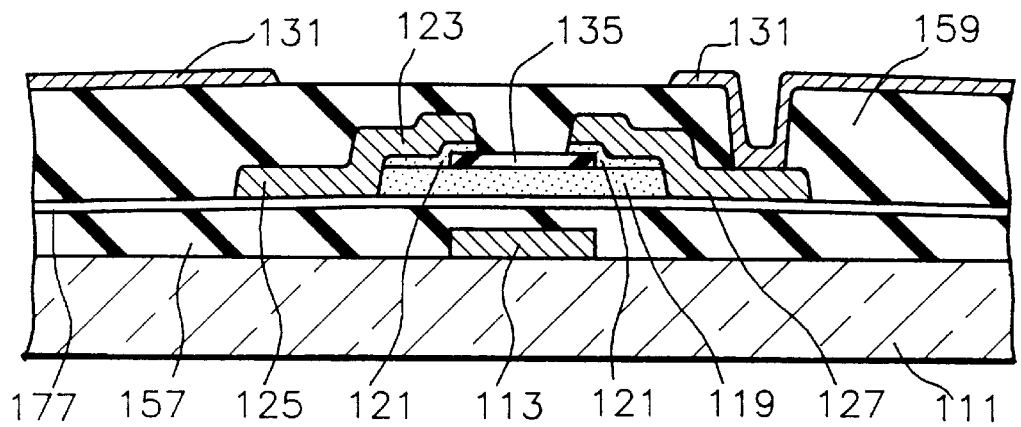

When there is an etch stopper layer in an inverse staggered type TFT, problems such as electron trap do not occur at the interface between a semiconductor layer 119 and an organic insulation layer 159, since the etch stopper layer is formed from an inorganic material. Thus, in the etch stopper case including the etch stopper layer 135, it is sufficient to form the first inorganic film between the semiconductor layer 119 and the gate insulation layer 157 (FIG. 14D).

Figure 14E:
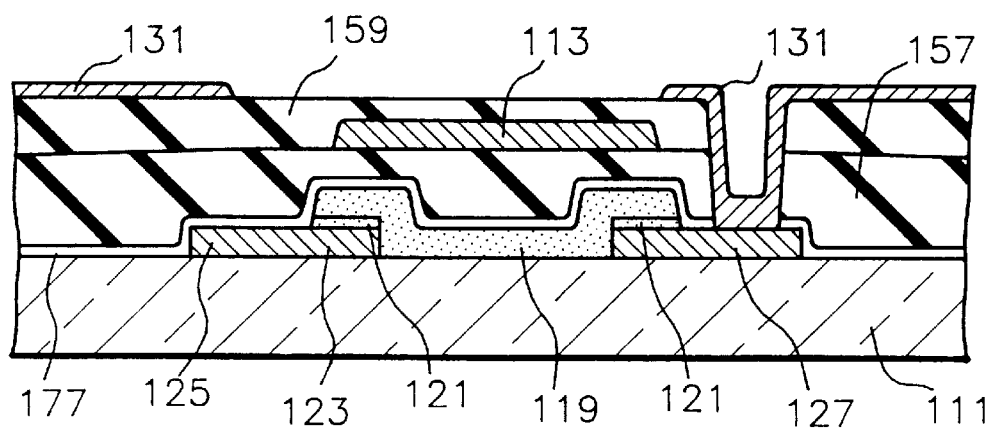

FIG. 14E shows the case of manufacturing a staggered type TFT. After forming a semiconductor layer 119 on a substrate 111, a first inorganic film 177 is deposited prior to the formation of an organic insulation layer 157. This eliminates problems such as detachment and electron trap which could occur at the interface between the gate insulation layer 157 and the semiconductor layer 119.

Figure 14F:
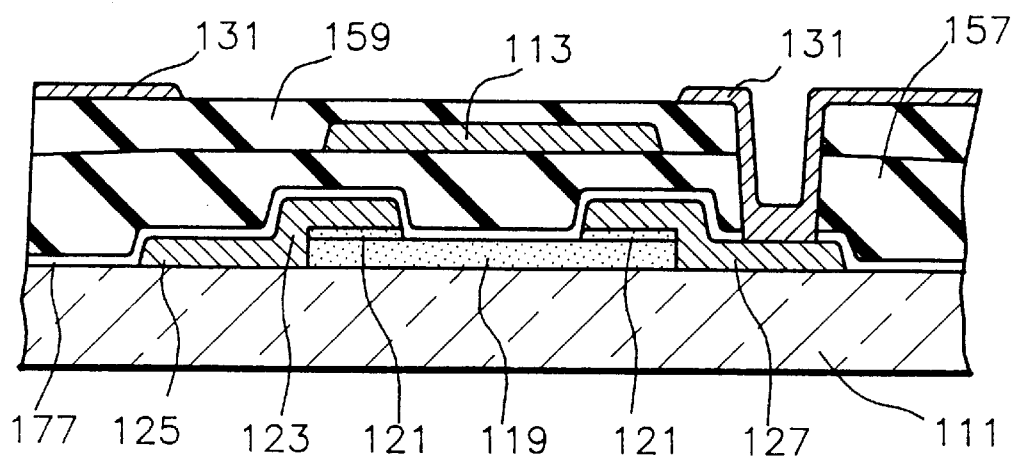

FIG. 14F shows the case of manufacturing a coplanar type TFT. After forming a semiconductor layer 119 and the source and drain electrodes 123 and 127, a first inorganic film 177 is deposited prior to the formation of an organic gate insulation layer 157. This eliminates problems such as detachment and electron trap which could occur at the interface between the gate insulation layer 157 and the semiconductor layer 119.

Figure 14G:
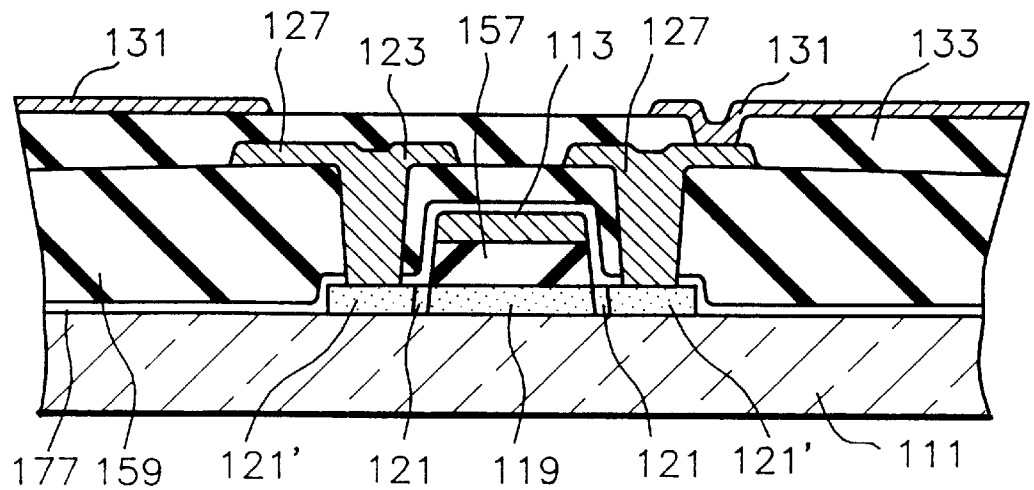

FIG. 14G shows the case of manufacturing a self-aligned type TFT. After forming a semiconductor layer 119, a gate insulation layer 157, and a gate electrode 113, a first inorganic film 177 is deposited. In this case, it is not necessary for the gate insulation layer 157 to be formed of an organic material, since the stepped profile due to the structure of the self-aligned TFT is independent of planarization property of the gate insulation material. Thus, if an organic material is not used for the gate insulation layer 157, an inorganic film between a gate insulation layer 157 and semiconductor layer 119 is not necessary. In this case, only the first inorganic film 177 is necessary at the interface between the organic protection film 159 and the impurity-doped semiconductor layer 121'.

Sixth Preferred Embodiment

Referring to FIGS. 15A to 15G and 16A to 16G, a sixth preferred embodiment is described. Hereinafter, for the description with respect to the sixth, seventh, and eighth preferred embodiments, an organic material includes, for example, Fluorinated polyimide, Teflon, cytop, fluoropolyarylether, Fluorinated parylene, PFCB, or BCB, and an inorganic material includes silicon nitride and silicon oxide.

In an ITO on passivation (IOP) structure, in which a pixel electrode 131 is formed on a protection film 159, an additional third inorganic film 181 may be formed prior to forming the pixel electrode 132 in order to improve adhesion between the pixel electrode 131 and the organic protection film 159. This sixth embodiment is a modification of the first to fifth embodiments described above, and has such an IOP structure. The organic film is formed by, for example, a CVD method. FIGS. 15A to 15G and 16A to 16G illustrate such structures including the third inorganic film 181 on the protection film in the various types of TFT structures. In FIGS. 15A to 15G and 16A to 16G, the gate insulation layer 157 and the protection layer 159 are organic layers. These structures produce a stable interface between the pixel electrode 131 and the protection film 159.

Figure 15A:
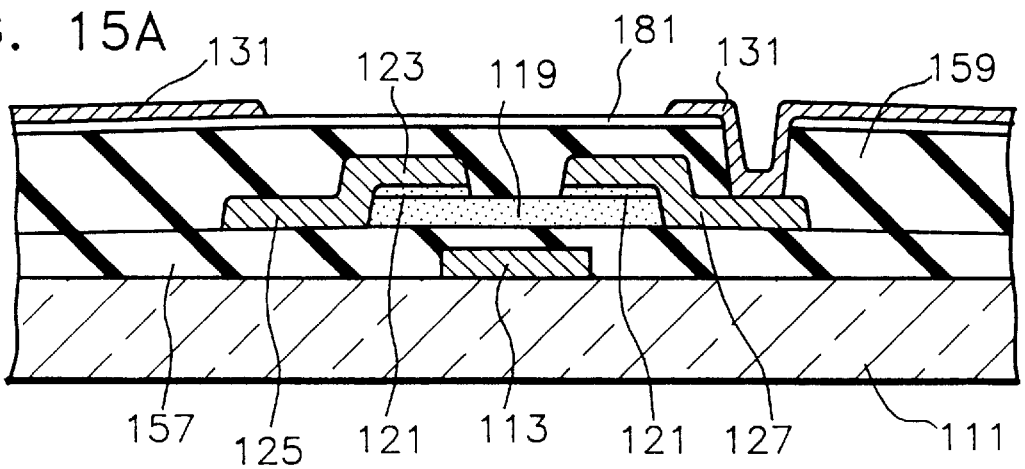
FIGS. 15A to 15E are cross-sectional views of various thin film transistors for a liquid crystal display using an inorganic layer between the protection layer made of an organic layer and a pixel electrode according to a sixth embodiment of the present invention.
Figure 15B:
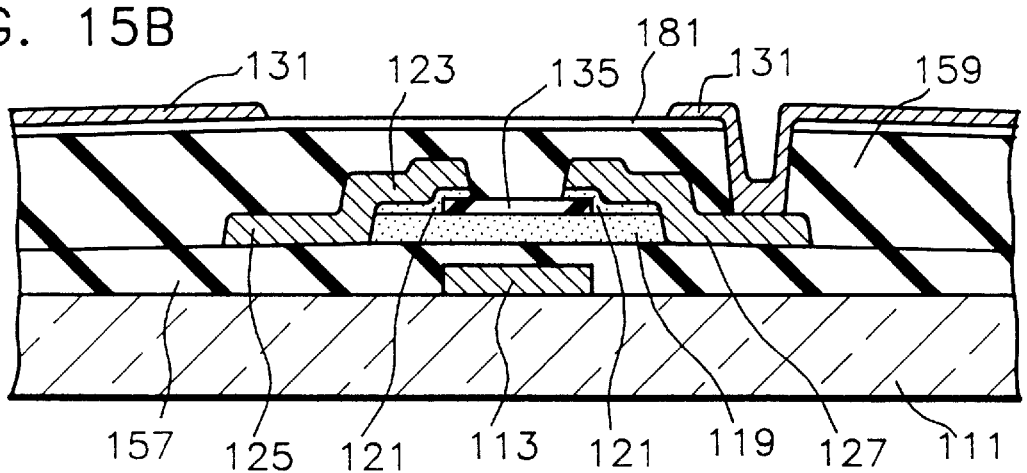
Figure 15C:
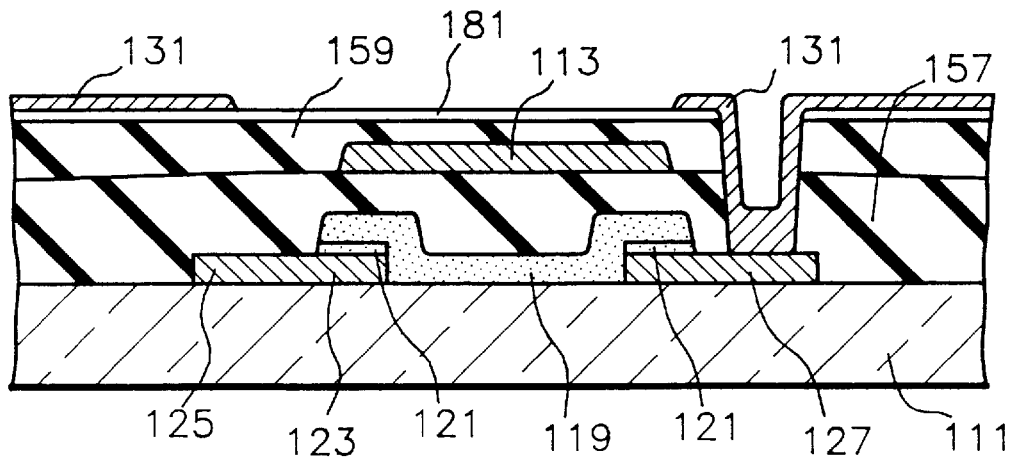
Figure 15D:
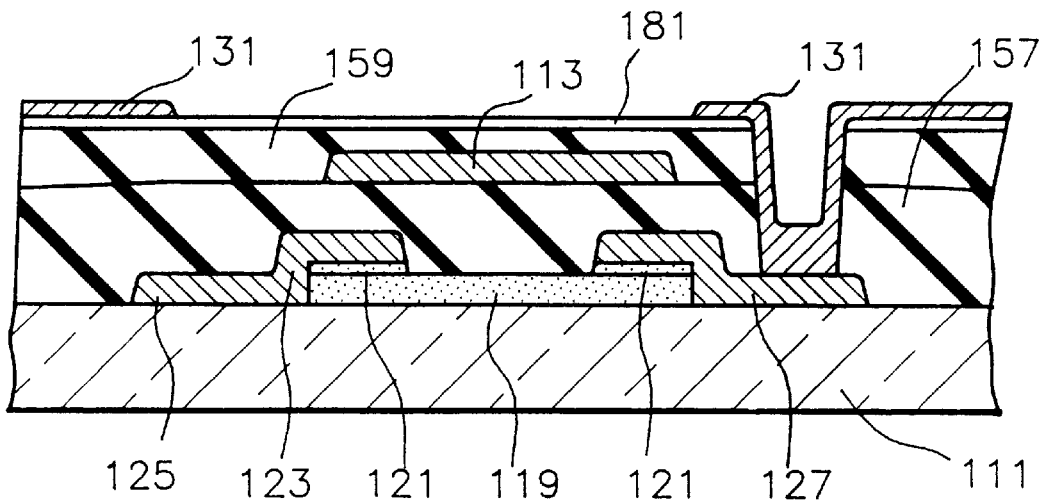
Figure 15E:
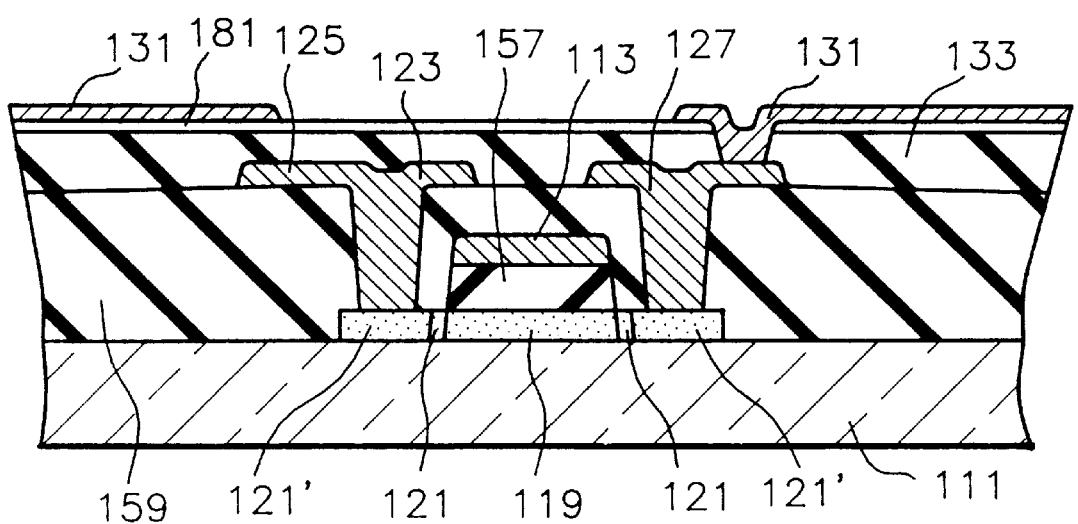

FIGS. 15A to 15E illustrate the third inorganic film 181 between the protection film 159 and the pixel electrode 131 in accordance with the present invention for various types of TFT. In particular, FIG. 15A shows an inverse staggered TFT, FIG. 15B shows an inverse staggered TFT (similar to FIG. 15A) with an etch stopper layer 135 on the semiconductor layer 119, FIG. 15C shows a staggered TFT, FIG. 15D shows a coplanar TFT, and FIG. 15E shows a self-aligned TFT.

Figure 16A:
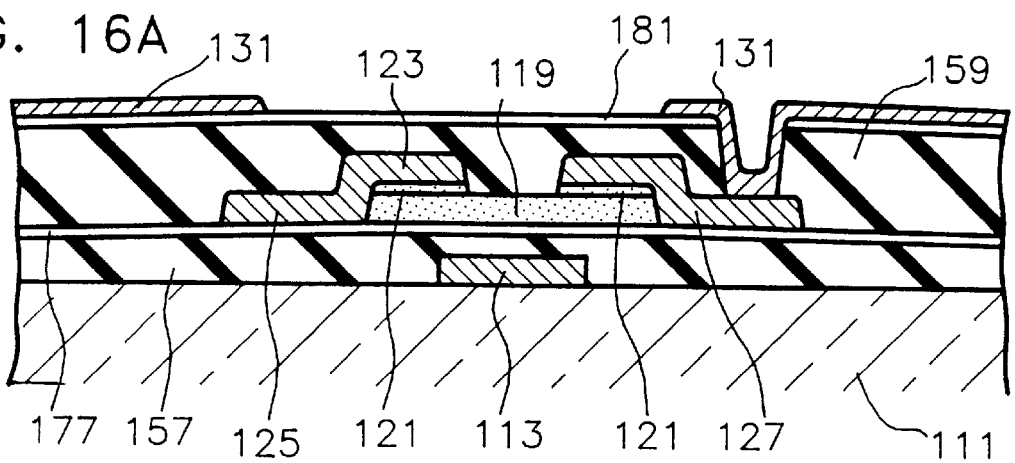
FIGS. 16A to 16G are cross-sectional views of various thin film transistors for a liquid crystal display using a first inorganic layer between the protection layer made of an organic layer and a pixel electrode, and a second inorganic layer between semiconductor and organic layers as alternatives to the sixth embodiment of the present invention.
Figure 16B:
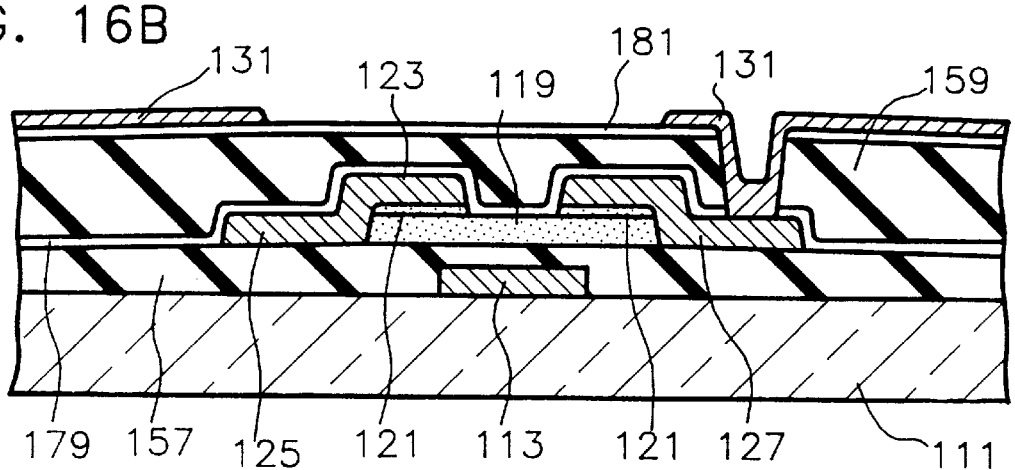
Figure 16C:
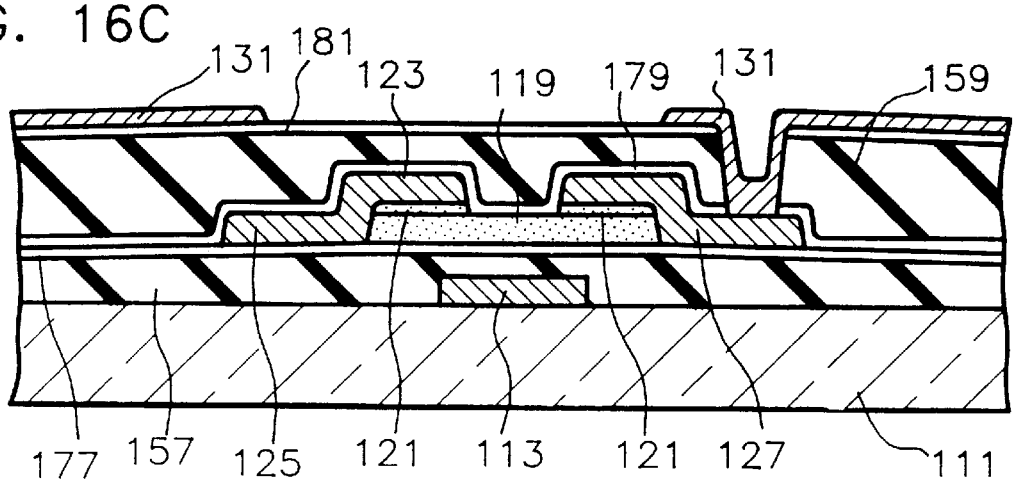
Figure 16D:
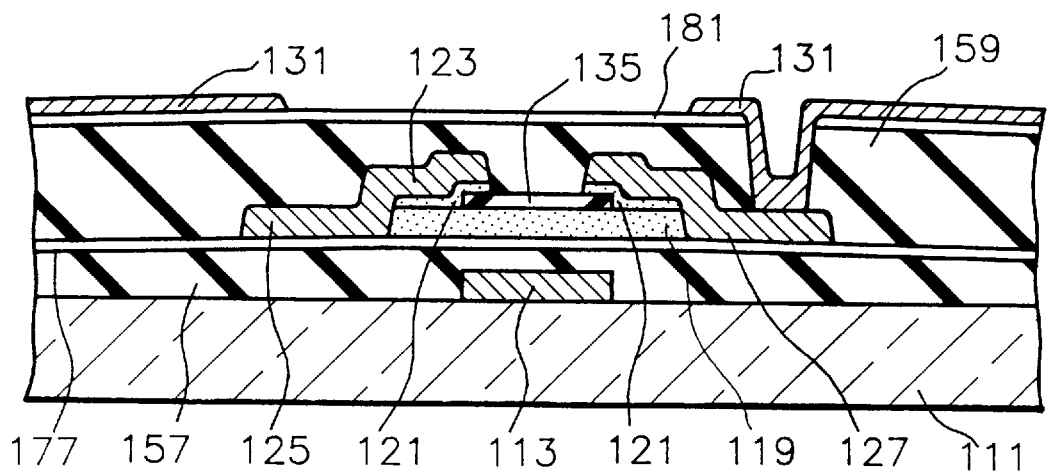
Figure 16E:
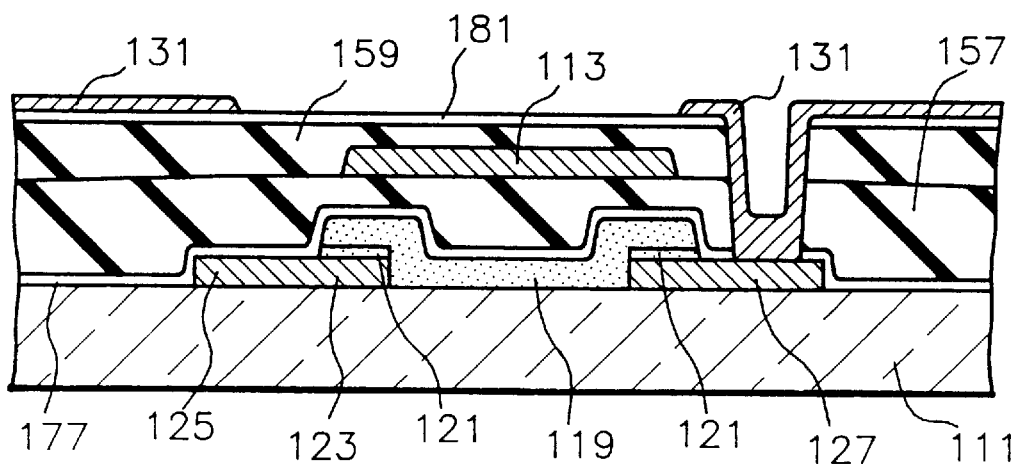
Figure 16F:
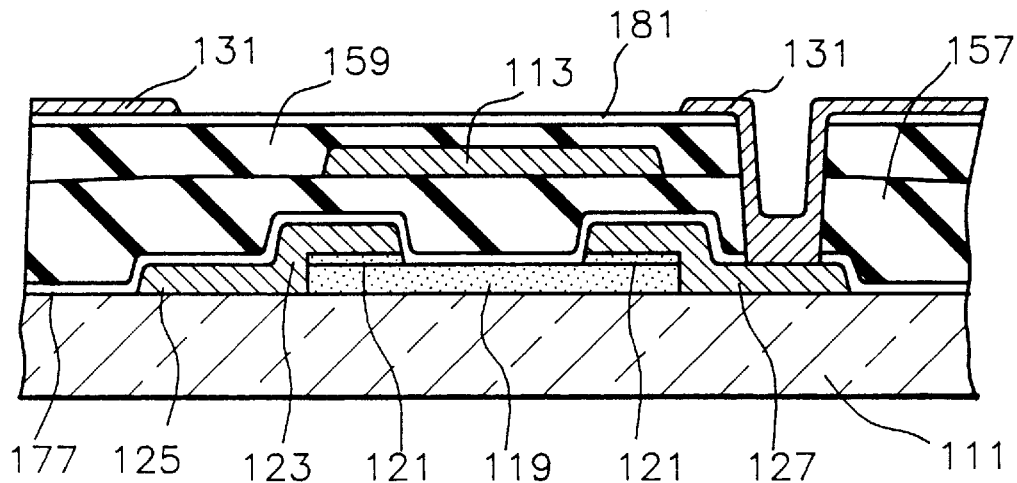
Figure 16G:
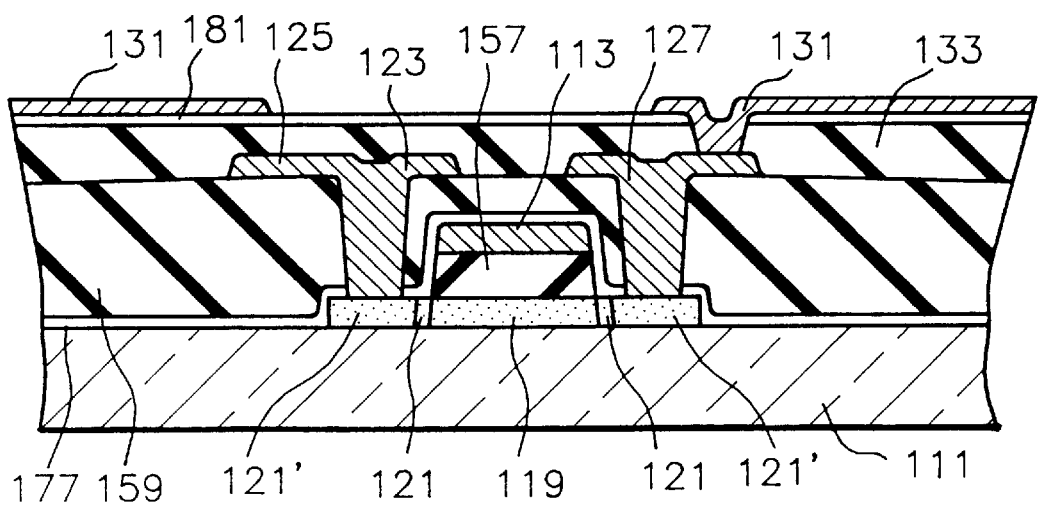

FIGS. 16A to 16G illustrate the third inorganic film 181 similar to FIGS. 15A to 15E and also the first inorganic film 177 and/or second inorganic film 179 in accordance with the present invention for various types of TFT. For example, FIG. 16A shows an inverse staggered TFT having the third inorganic film 181 between the protection film 159 and the pixel electrode 131, with the first inorganic film 177 between the gate insulation layer 157 and the semiconductor layer 119. FIG. 16B shows an inverse staggered TFT having the third inorganic film 181, with the second inorganic film 179 deposited prior to forming an organic protection film 159. FIG. 16C show an inverse staggered TFT having the third inorganic film 181, with the first inorganic film 177 (similar to FIG. 16A) and the second inorganic film 179 (similar to FIG. 16B). FIG. 16D shows an inverse staggered TFT having the third inorganic film 181, with an etch-stopper layer 135, and the second inorganic film 179 (similar to FIG. 16B). FIG. 16E shows a staggered TFT having the third inorganic film 181, with the first inorganic film 177 deposited prior to forming the organic insulation layer 157. FIG. 16F shows a coplanar TFT having the third inorganic film 181, with the first inorganic film 177 deposited prior to forming the organic insulation layer 157. FIG. 16G shows a self-aligned TFT having the third inorganic film 181, with the first inorganic film 177 deposited prior to forming the organic protection film 159.

Seventh Preferred Embodiment

Referring to FIGS. 17A to 17D and 18A to 18D, a seventh preferred embodiment is described. FIGS. 17A to 17D and 18A to 18D show the present invention where the gate insulation layers are made of an organic material and the protection films are made of an inorganic material. That is, the organic protection film 159 in the first to fifth embodiments above is replaced by an inorganic protection film 139.

Figure 17A:
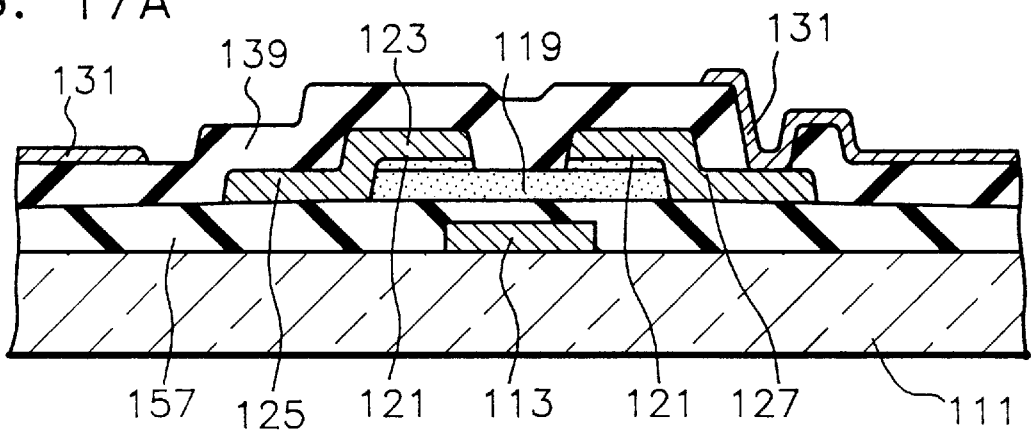
FIGS. 17A to 17D are cross-sectional views showing the structures of various thin film transistors according to the seventh embodiment of the present invention.
Figure 17B:
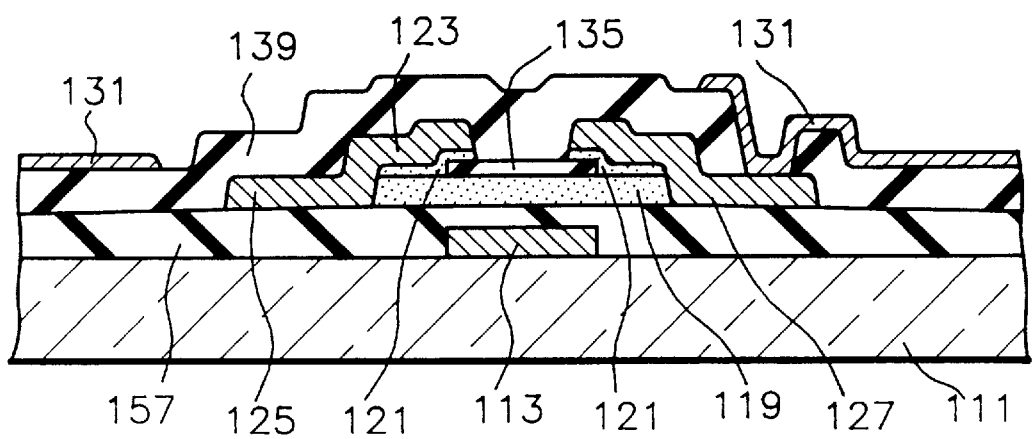
Figure 17C:
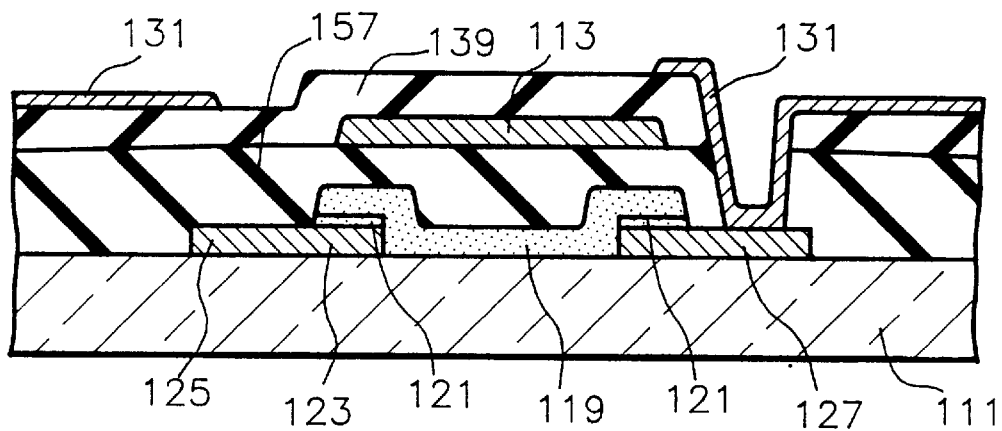
Figure 17D:
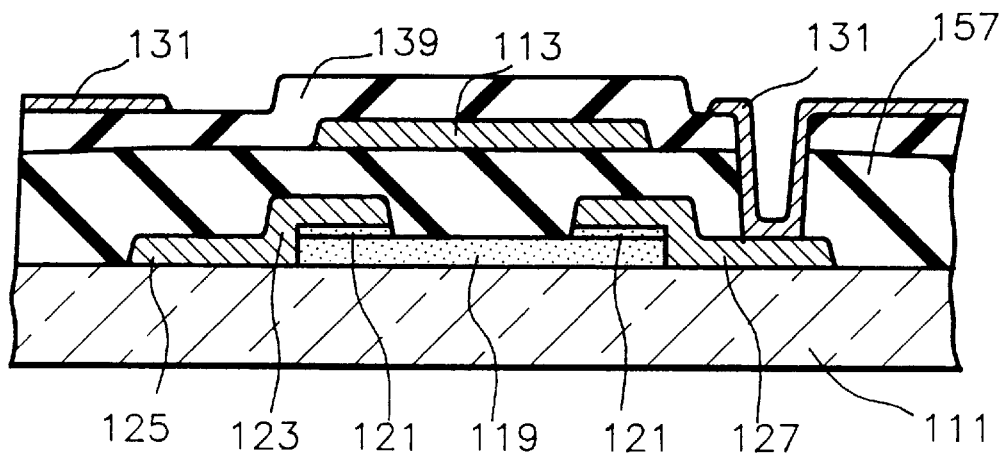

FIG. 17A shows an inverse staggered TFT, wherein the gate insulation layer 157 is made of an organic material, and the protection film 139 is made of an inorganic material. FIG. 17B shows an inverse staggered TFT with an etch stopper layer 135, wherein the gate insulation layer 157 is made of an organic material and the protection film 139 is made of an inorganic material. FIG. 17C shows a staggered TFT, wherein the gate insulation layer 157 is made of an organic material, and the protection film 139 is made of an inorganic material. FIG. 17D shows a coplanar TFT, wherein the gate insulation layer 157 is made of an organic material and the protection film 139 is made of an inorganic material.

Figure 18A:
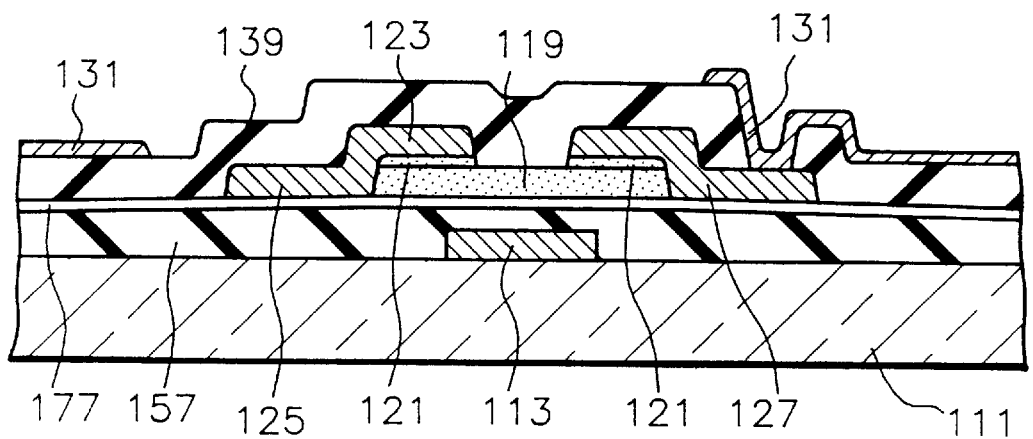
FIGS. 18A to 18D are cross-sectional views showing the structures of various thin film transistors including an inorganic layer formed between semiconductor and gate insulation layers as alternatives to the seventh embodiment of the present invention.
Figure 18B:
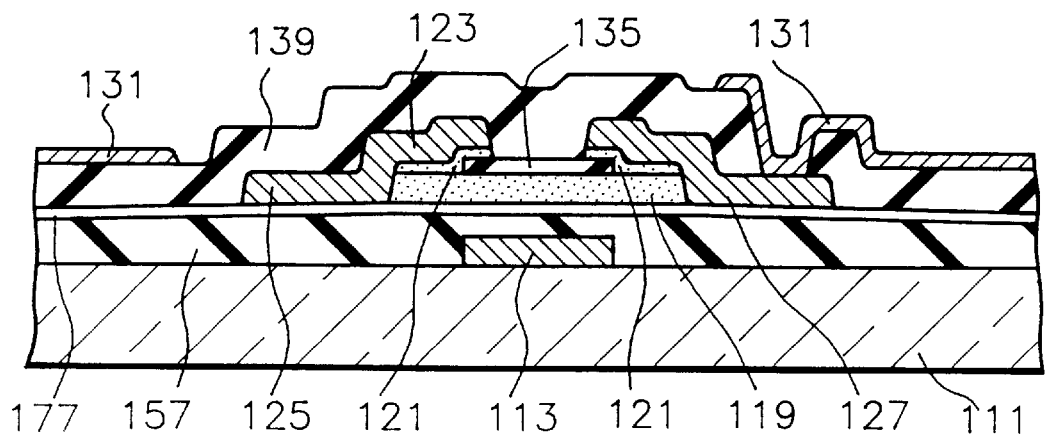
Figure 18C:
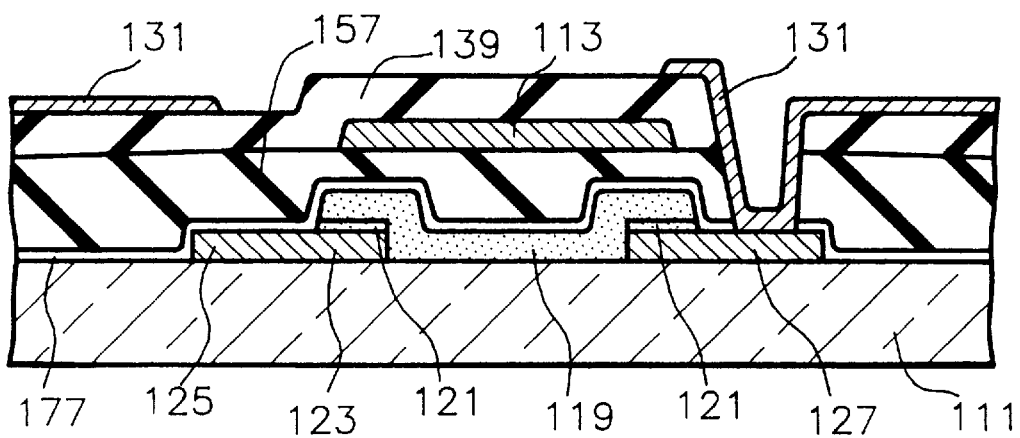

Also, an intermediate film comprising an inorganic material can be formed between the gate insulation layer 157 and the semiconductor layer 119. For example, FIG. 18A shows an inverse staggered TFT with the first inorganic film 177, where the gate insulation layer 157 is made of an organic material, and the protection film 139 is made of an inorganic material. FIG. 18B shows an inverse staggered TFT with the first inorganic film 177 and an etch stopper layer 135 formed prior to forming the semiconductor layer 119, where the gate insulation layer 157 is made of an organic material and the protection film 139 is made of an inorganic material. FIG.

Figure 18D:
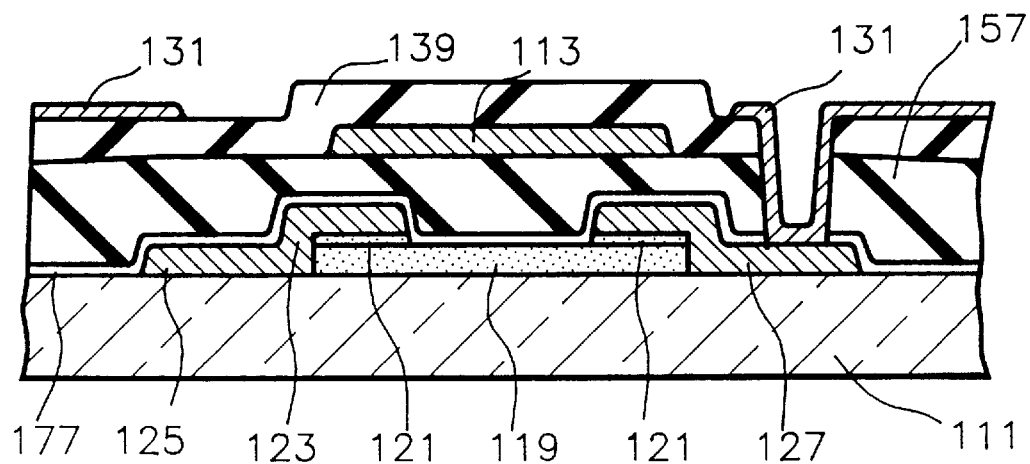

18C shows a staggered TFT with the first inorganic film 177, where the gate insulation layer 157 is made of an organic material and the protection film 139 is made of an organic material. FIG. 18D shows a coplanar TFT with the first inorganic film 177, where the gate insulation layer 157 is made of an organic material, and the protection film 139 is made of an inorganic material.

Eighth Preferred Embodiment

Figure 19A:
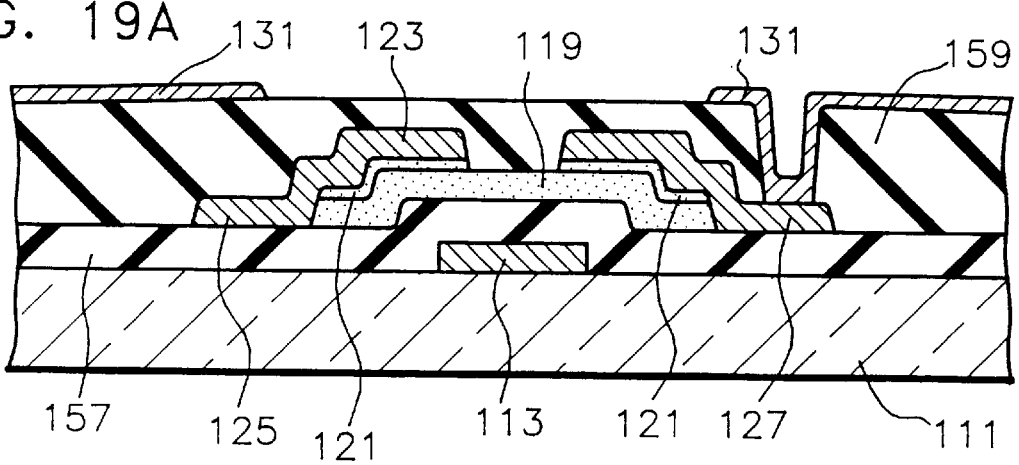
FIGS. 19A to 19F are cross-sectional views showing the structures of various thin film transistors according to an eighth embodiment of the present invention.
Figure 19B:
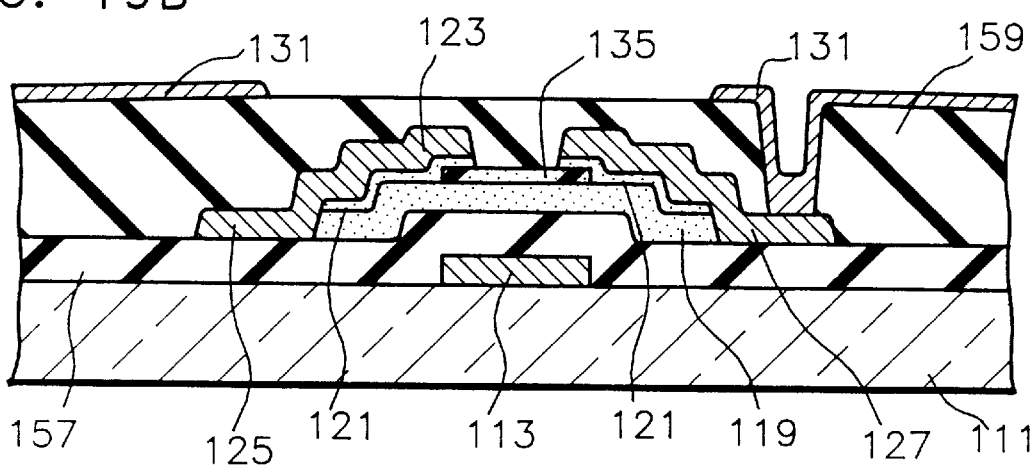
Figure 19C:
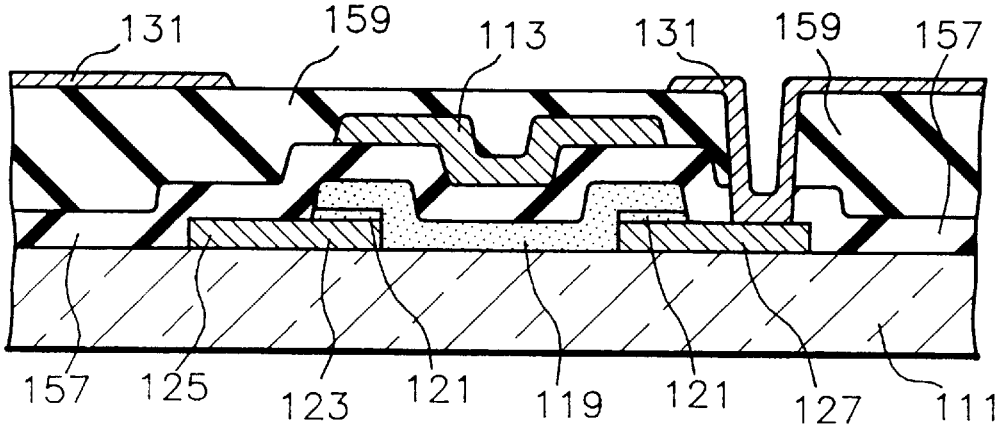
Figure 19D:
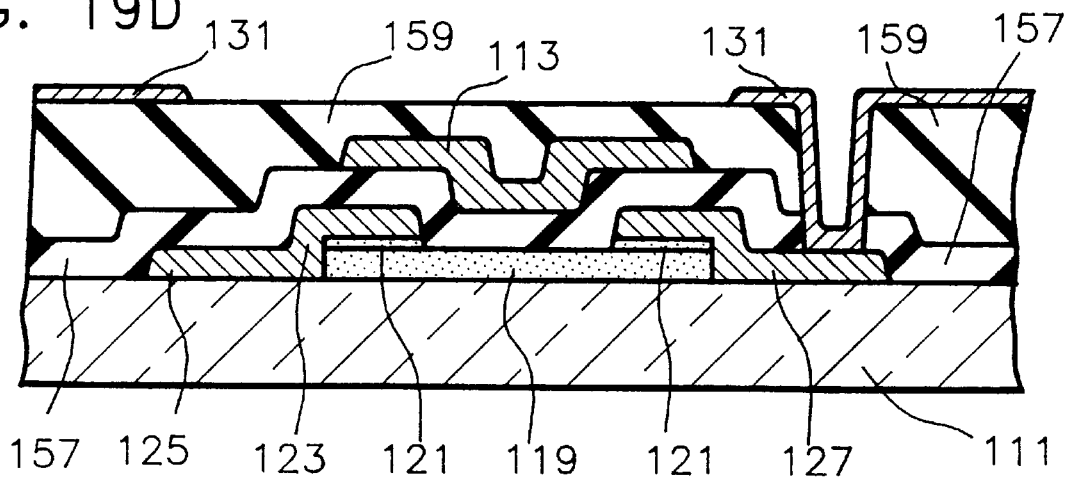
Figure 19E:
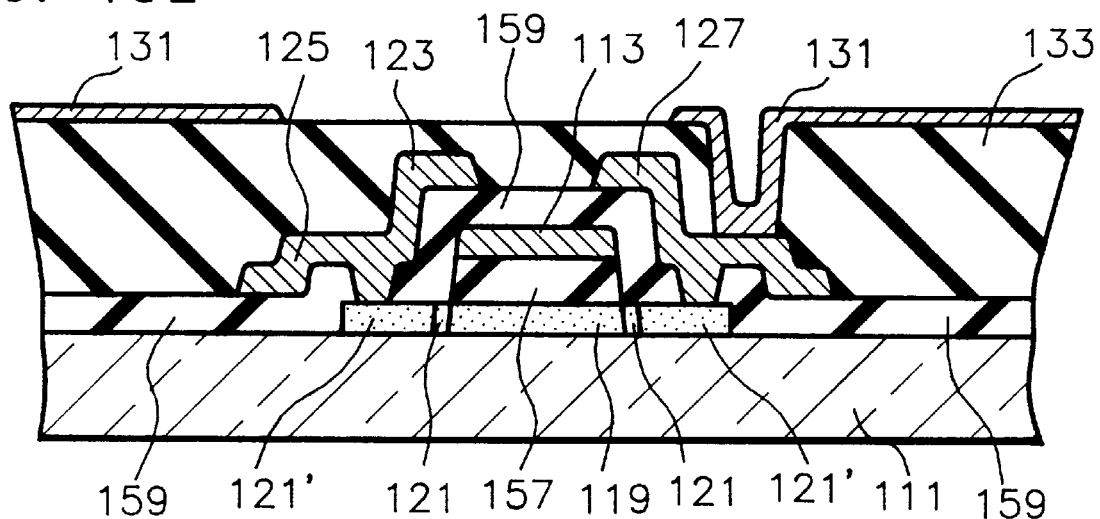
Figure 19F:
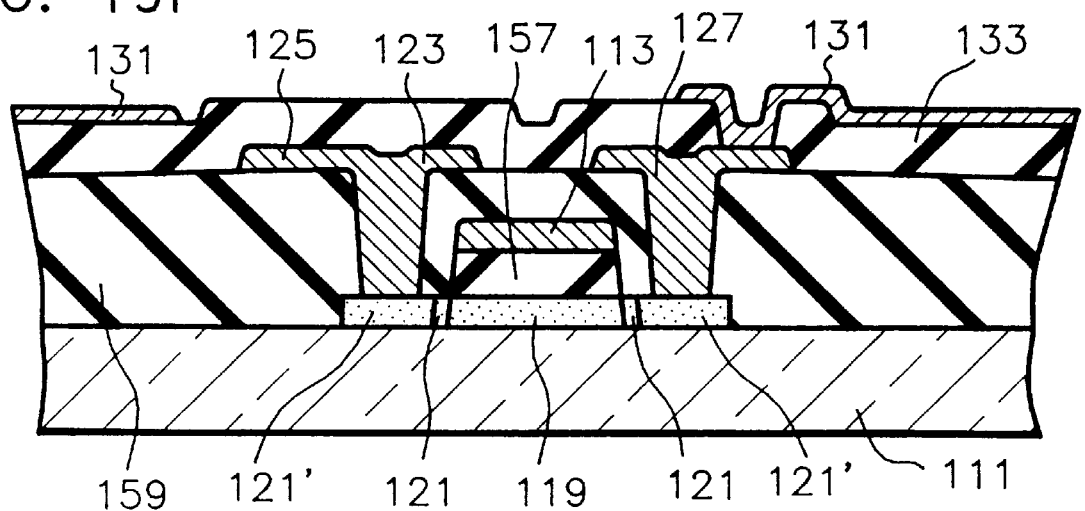

Referring to FIGS. 19A to 19F, 20A to 20E, 21A, and 213, an eight preferred embodiment of the present invention is described. In this embodiment, the protection film 159 is made of an organic material and the gate insulation layer 157 is made of an inorganic material, except in the case of a self-aligned TFT. In the self-aligned TFT, one of the first and second protection films is preferably an organic layer and the other is preferably an inorganic layer. For example, FIG. 19A shows an inverse staggered TFT, wherein the protection film 159 is made of an organic material, and the gate insulation layer 157 is made of an inorganic material. FIG. 19B shows an inverse staggered TFT with the etch stopper layer 135, wherein the protection film 159 is made of an organic material, and the gate insulation layer 157 is made of an inorganic material, with the etch stopper layer 135. FIG. 19C shows a staggered TFT, wherein the protection film 159 is made of an organic material and the gate insulation layer 157 is made of an inorganic material. FIG. 19D shows a coplanar TFT, wherein the protection film 159 is made of an organic material, and the gate insulation layer 157 is made of an inorganic material. FIG. 19E shows a self-aligned coplanar TFT, wherein the first protection film 159 is made of an inorganic material and the second protection film 133 is made of an organic material. In this case, the gate insulation layer 157 can be either inorganic or organic because it does not influence the level-difference. FIG. 19F shows a coplanar TFT, wherein the first protection film 159 is made of an organic material and the second protection film 133 is made of an inorganic material. In this case, the gate insulation layer 157 can be either inorganic or organic because it does not influence the level-difference.

Figure 20A:
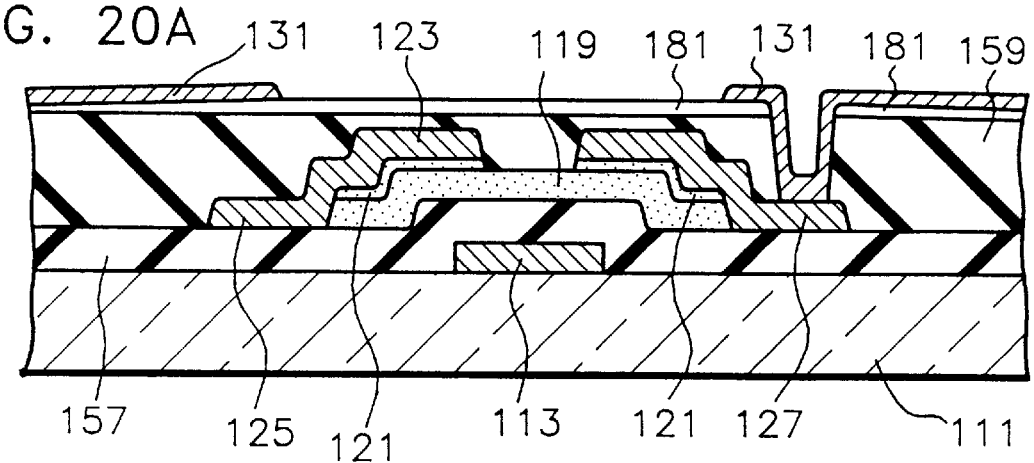
FIGS. 20A to 20E are cross-sectional views showing the structures of various thin film transistors including an inorganic layer formed between a pixel electrode and a protection layer as alternatives to the eighth embodiment of the present invention.
Figure 20B:
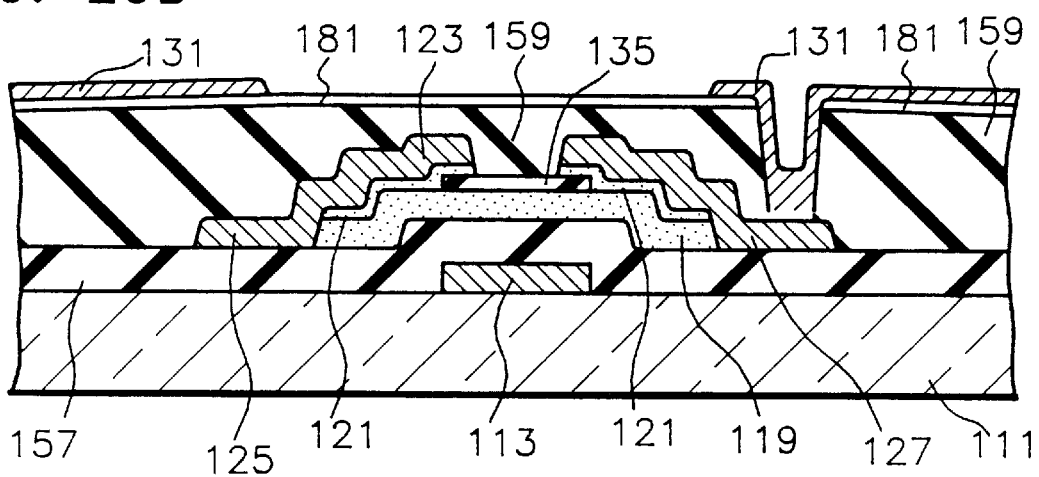
Figure 20C:
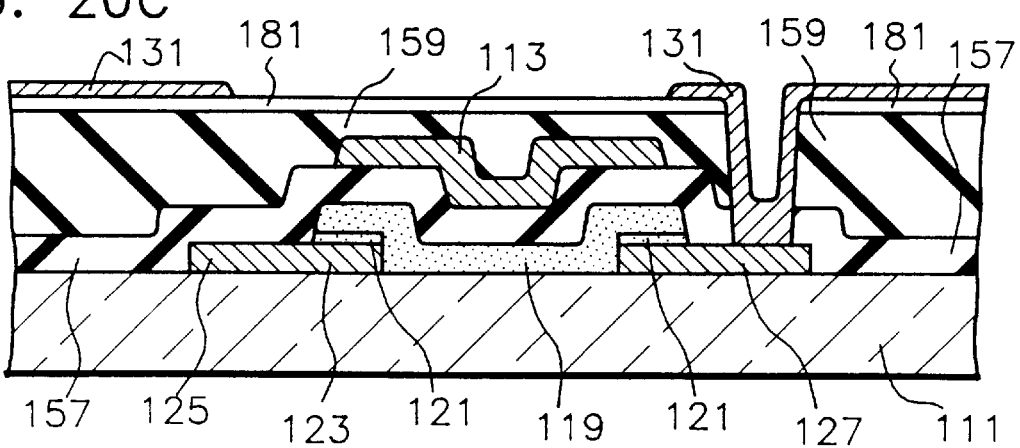
Figure 20D:
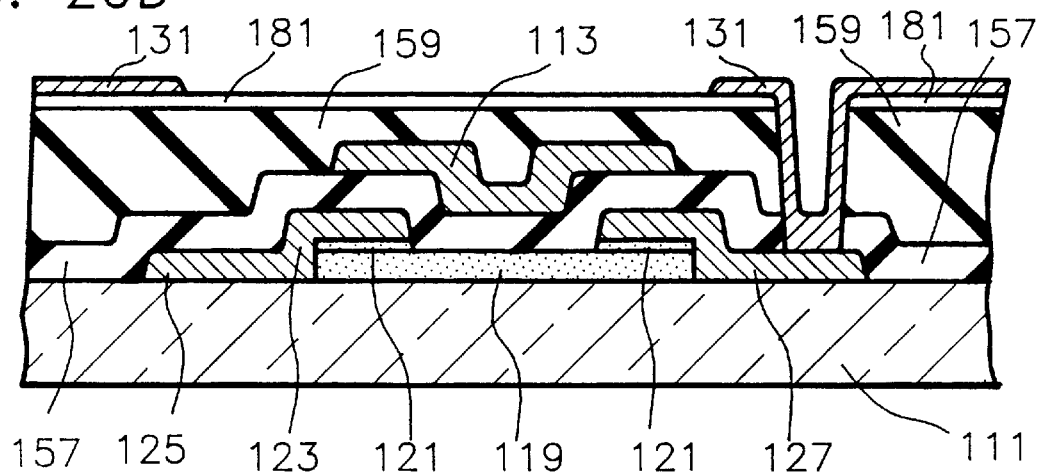
Figure 20E:
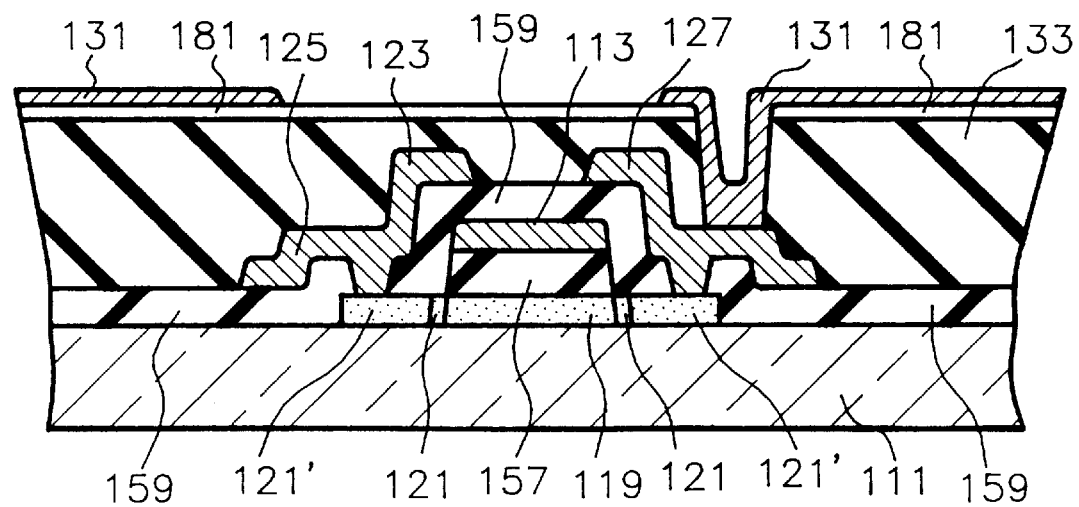

Moreover, in an ITO on passivation structure, in which a pixel electrode 131 is formed on a protection film 159, third inorganic film 181 may be formed in order to improve an adhesion property between the pixel electrode 131 and the organic protection film 159. For example, FIG. 20A shows an inverse staggered TFT with the third inorganic film 181 between the pixel electrode 131 and the protection film 159, wherein the protection film 159 is made of an organic material and the gate insulation layer 157 is made of an inorganic material. FIG. 20B shows an inverse staggered TFT having an etch stopper layer 135 and the third inorganic film 181, wherein the protection film 159 is made of an organic material and the gate insulation layer 157 is made of an inorganic material. FIG. 20C shows a staggered TFT with the third inorganic film 181, wherein the protection film 159 is made of an organic material and the gate insulation layer 157 is made an inorganic material. FIG. 20D shows a coplanar TFT with the third inorganic film 181, wherein the protection film 159 is made of an organic material and the gate insulation layer 157 is made of an inorganic material. FIG. 20E shows a self-aligned TFT with the third inorganic film 181 between the second protection film 133 and the pixel electrode 131, wherein the second protection film 133 is made of an organic material and the gate insulation layer 157 and the first protection film 159 are made of an inorganic material.

Figure 21A:
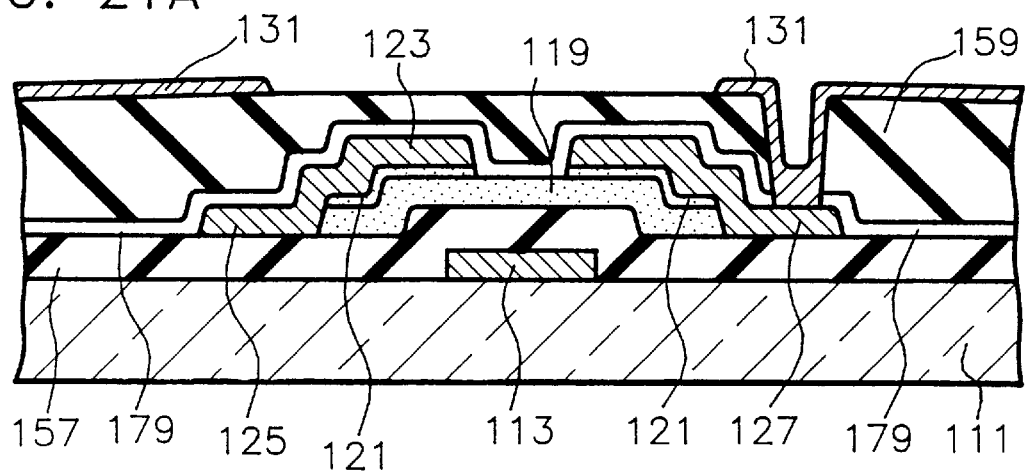
FIGS. 21A and 21B are cross-sectional views showing the structures of various thin film transistors, including an inverse staggered structure as alternatives to the eighth embodiment of the present invention.
Figure 21B:
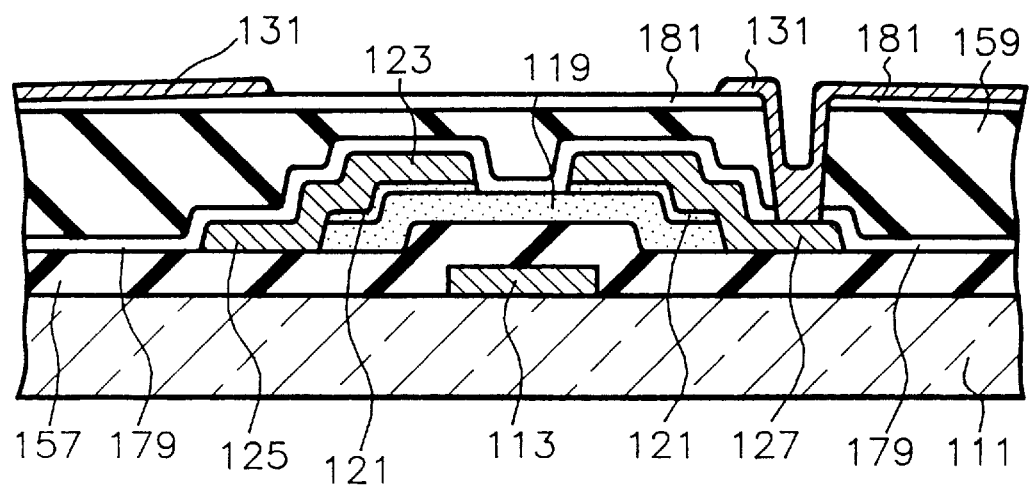

For the cases with an inverse staggered TFT, the semiconductor layer 119 is in contact with the protection film 159. Thus, the second inorganic film 179 may be formed prior to formation of the organic protection film 159. For example, FIG. 21A shows an inverse staggered TFT without an etch stopper layer, where the protection film 159 is made of an organic material and the gate insulation layer 157 is made of an inorganic material. Hence, the second inorganic film 179 is formed prior to forming the organic protection film 159. Moreover, FIG. 21B shows an inverse staggered TFT with the second inorganic film 179 and the third inorganic film 181, where the protection film 159 is made of an organic material and the gate insulation layer 157 is made of an inorganic material.

In the present invention, an organic material was used as an insulation and/or protection film in an LCD. Thus, an LCD having a superior performance is obtained as compared to a conventional LCD which uses silicon oxide or silicon nitride for the insulation and/or protection film. The superior insulation property is obtained by using an organic material such as Fluorinated polyimide, Teflon, cytop, fluoropolyarylether, Fluorinated parylene, PFCB, or BCB, for a gate insulation layer. Also, a smoother surface of a protection film is obtained by using an organic material such as Fluorinated polyimide, Teflon, cytop, fluoropolyarylether, Fluorinated parylene, PFCB, or BCB, on a stepped surface due to the multilayered structure of the TFT. It also becomes possible to form a wider pixel electrode than in a conventional method, improving the aperture ratio. Moreover, an orientation film, which determines an initial liquid crystal orientation, becomes smoother allowing uniform rubbing of the orientation film. Accordingly, an LCD with a superior quality and performance to a conventional LCD can be manufactured by the present invention.

It will be apparent to those skilled in the art that various modifications and variations can be made in a liquid crystal display and a method for manufacturing the same of the present invention without departing from the spirit or scope of the invention. Thus, it is intended that the present invention cover the modifications and variations of this invention provided they come within the scope of the appended claims and their equivalents.

What is claimed is:

1. A method for manufacturing a transistor on a substrate for a liquid crystal display, the method comprising the steps of:

forming a transistor over the substrate, the transistor having a gate, a source, a drain, a semiconductor layer, and a gate insulation layer, wherein the gate insulation layer includes at least one of Fluorinated polyimide, Teflon, cytop, fluoropolyarylether, Fluorinated parylene, PFCB, and BCB;

forming a protection film over the transistor, the protection film including at least one of Fluorinated polyimide, Teflon, cytop, fluoropolyarylether, Fluorinated parylene, PFCB, and BCB;

forming a first inorganic layer between the protection film and the transistor;

forming a second inorganic layer between the gate insulation layer and the semiconductor layer;

forming a third inorganic layer over the protection film; and forming a pixel electrode over the third inorganic layer, the pixel electrode being connected to one of the source and the drain.

2. A method for manufacturing a transistor on a substrate for a liquid crystal display, the method comprising the steps of:

providing a substrate;
forming a transistor over the substrate, the transistor having a gate, a source, a drain, a semiconductor layer, and a gate insulation layer, wherein the gate insulation layer includes at least one of Fluorinated polyimide, Teflon, cytop, fluoropolyarylether, Fluorinated parylene, PFCB, and BCB;
forming a first inorganic layer between the gate insulation layer and the semiconductor layer;
forming a protection film over the transistor;
forming a second inorganic layer over the protection film; and
forming a pixel electrode over the second inorganic layer, the pixel electrode being connected to one of the source and the drain.

3. A transistor substrate for a liquid crystal display comprising:
a substrate;
a transistor over the substrate, the transistor having a gate, a source, a drain, a semiconductor layer, and a gate insulation layer, wherein the gate insulation layer includes at least one of Fluorinated polyimide, Teflon, cytop, fluoropolyarylether, Fluorinated parylene, PFCB, and BCB;
a protection film over the transistor, the protection film having a contact hole and including at least one of Fluorinated polyimide, Teflon, cytop, fluoropolyarylether, Fluorinated parylene, PFCB, and BCB;
a gate bus line connected to the gate of the transistor;
a signal bus line connected to one of the source and the drain of the transistor; and
a pixel electrode over the protection film, the pixel electrode being connected to another one of the source and the drain of the transistor through the contact hole,
wherein at least one of the gate bus line and signal bus line is located under the protection film, and the pixel electrode overlaps at least a portion of one of the gate bus line and the signal bus line located under the protection film.

4. The transistor substrate according to claim 3, wherein the gate insulation layer has a first surface facing toward the substrate and a second surface facing away from the substrate, the second surface of the gate insulation layer being substantially flatter than the first surface of the gate insulation layer, and
wherein the protection film has a first surface facing toward the substrate and a second surface facing away from the substrate, the second surface of the protection film being substantially flatter than the first surface of the protection film.

5. The transistor substrate according to claim 3, further comprising:
a first inorganic layer between the protection film and the transistor; and
a second inorganic layer between the gate insulation layer and the semiconductor layer.

6. The transistor substrate according to claim 3, further comprising a third inorganic layer over the protection film, the third inorganic layer being under the pixel electrode.

7. A method for manufacturing a transistor on a substrate for a liquid crystal display, the method comprising the steps of:
forming a transistor over the substrate, the transistor having a gate, a source, a drain, a semiconductor layer, and a gate insulation layer, wherein the gate insulation layer includes at least one of Fluorinated polyimide, Teflon, cytop, fluoropolyarylether, Fluorinated parylene, PFCB, and BCB;
forming a protection film over the transistor, the protection film including at least one of Fluorinated polyimide, Teflon, cytop, fluoropolyarylether, Fluorinated parylene, PFCB, and BCB;
forming a gate bus line connected to the gate of the transistor;
forming a signal bus line connected to one of the source and the drain of the transistor; and
forming a pixel electrode over the protection film, the pixel electrode being connected to another one of the source and the drain of the transistor,
wherein at least one of the gate bus line and signal bus line is formed under the protection film, and the pixel electrode overlaps at least a portion of one of the gate bus line and the signal bus line located under the protection film.

8. The method for manufacturing a transistor on a substrate according to claim 7, wherein the gate insulation layer has a first surface facing toward the substrate and a second surface facing away from the substrate, the second surface of the gate insulation layer being substantially flatter than the first surface of the gate insulation layer, and
wherein the protection film has a first surface facing toward the substrate and a second surface facing away from the substrate, the second surface of the protection film being substantially flatter than the first surface of the protection film.

9. The method for manufacturing a transistor on a substrate according to claim 7, the method further comprising the steps of:
forming a first inorganic layer between the protection film and the transistor; and
forming a second inorganic layer between the gate insulation layer and the semiconductor layer.

10. The method for manufacturing a transistor on a substrate according to claim 7, the method further comprising the step of:
forming a third inorganic layer over the protection film, the third inorganic layer being located under the pixel electrode.

11. A transistor substrate for a liquid crystal display, comprising:
a substrate;
a transistor over the substrate, the transistor having a gate, a source, a drain, a semiconductor layer, and a gate insulation layer, wherein the gate insulation layer includes at least one of Fluorinated polyimide, Teflon, cytop, fluoropolyarylether, Fluorinated parylene, PFCB, and BCB;
a protection film over the transistor, the protection film including at least one of Fluorinated polyimide, Teflon, cytop, fluoropolyarylether, Fluorinated parylene, PFCB, and BCB;
a first inorganic layer between the protection film and the transistor;
a second inorganic layer between the gate insulation layer and the semiconductor layer;
a third inorganic layer over the protection film; and
a pixel electrode over the third inorganic layer, the pixel electrode being connected to one of the source and the drain.

12. A transistor substrate for a liquid crystal display, comprising:

a substrate;

a transistor over the substrate, the transistor having a gate, a source, a drain, a semiconductor layer, and a gate insulation layer, the gate insulation layer including at least one of Fluorinated polyimide, Teflon, cytop, fluoropolyarylether, Fluorinated parylene, PFCB, and BCB, the transistor further including a first inorganic layer between the gate insulation layer and the semiconductor layer;

a protection film over the transistor;

a second inorganic layer over the protection film; and a pixel electrode over the second inorganic layer, the pixel electrode being connected to one of the source and the drain.

13. A transistor substrate for a liquid crystal display comprising:

a substrate;

a transistor over the substrate, the transistor having a gate, a source, a drain, a semiconductor layer, and a gate insulation layer, wherein the gate insulation layer includes an organic insulation material;

a protection film over the transistor, the protection film having a contact hole and including at least one of Fluorinated polyimide, Teflon, cytop, fluoropolyarylether, Fluorinated parylene, PFCB, and BCB;

a gate bus line connected to the gate of the transistor;

a signal bus line connected to one of the source and the drain of the transistor; and a pixel electrode over the protection film, the pixel electrode being connected to another one of the source and drain of the transistor through the contact hole, wherein at least one of the gate bus line and signal bus line is located under the protection film, and the pixel electrode overlaps at least a portion of one of the gate bus line and the signal bus line located under the protection film.

14. The transistor substrate according to claim 13, wherein the gate insulation layer has a first surface facing toward the substrate and a second surface facing away from the substrate, the second surface of the gate insulation layer being substantially flatter than the first surface of the gate insulation layer.

15. The transistor substrate according to claim 14, wherein the gate insulation layer is over the gate, and the semiconductor layer is over the gate insulation layer.

16. The transistor substrate according to claim 14, wherein the protection film has a first surface facing toward the substrate and a second surface facing away from the substrate, the second surface of the protection film being substantially flatter than the first surface of the protection film.

17. The transistor substrate according to claim 13, further comprising:

a first inorganic layer between the protection film and the transistor; and a second inorganic layer between the gate insulation layer and the semiconductor layer.

18. The transistor substrate according to claim 13, further comprising a third inorganic layer over the protection film, the third inorganic layer being under the pixel electrode.

19. A method for manufacturing a transistor on a substrate for a liquid crystal display, the method comprising the steps of:

forming a transistor over the substrate, the transistor having a gate, a source, a drain, a semiconductor layer, and a gate insulation layer, wherein the gate insulation layer includes an organic insulation material;

forming a protection film over the transistor, the protection film including at least one of Fluorinated polyimide, Teflon, cytop, fluoropolyarylether, Fluorinated parylene, PFCB, and BCB;

forming a gate bus line connected to the gate of the transistor;

forming a signal bus line connected to one of the source and the drain of the transistor; and forming a pixel electrode over the protection film, the pixel electrode being connected to another one of the source and the drain of the transistor, wherein at least one of the gate bus line and signal bus line is formed under the protection film, and the pixel electrode overlaps at least a portion of one of the gate bus line and the signal bus line located under the protection film.

20. The method according to claim 19, wherein the gate insulation layer has a first surface facing toward the substrate and a second surface facing away from the substrate, the second surface of the gate insulation layer being substantially flatter than the first surface of the gate insulation layer.

21. The method according to claim 20, wherein the step of forming the transistor includes the steps of:

forming the gate over the substrate;

forming the gate insulation layer over the gate; and forming the semiconductor layer over the gate insulation layer.

22. The method according to claim 20, wherein the protection film has a first surface facing toward the substrate and a second surface facing away from the substrate, the second surface of the protection film being substantially flatter than the first surface of the protection film.

23. The method according to claim 19, further comprising the steps of:

forming a first inorganic layer between the protection film and the transistor; and forming a second inorganic layer between the gate insulation layer and the semiconductor layer.

24. The method according to claim 19, further comprising the step of:

forming a third inorganic layer over the protection film, the third inorganic layer being located under the pixel electrode.

* * * * *